US008685857B2

(12) United States Patent
Matsui et al.

(10) Patent No.: US 8,685,857 B2
(45) Date of Patent: Apr. 1, 2014

(54) CHEMICAL MECHANICAL POLISHING METHOD OF ORGANIC FILM AND METHOD OF MANUFACTURING SEMICONDUCTOR DEVICE

(75) Inventors: Yukiteru Matsui, Yokohama (JP); Gaku Minamihaba, Yokohama (JP); Yoshikuni Tateyama, Oita (JP); Hiroyuki Yano, Yokohama (JP); Atsushi Shigeta, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 819 days.

(21) Appl. No.: 12/289,326

(22) Filed: Oct. 24, 2008

(65) Prior Publication Data

US 2009/0068841 A1 Mar. 12, 2009

Related U.S. Application Data

(62) Division of application No. 10/855,529, filed on May 28, 2004, now Pat. No. 7,452,819.

(30) Foreign Application Priority Data

Jun. 2, 2003 (JP) .................................. 2003-157154
Mar. 17, 2004 (JP) .................................. 2004-076408

(51) Int. Cl.
*H01L 21/304* (2006.01)
*B44C 1/22* (2006.01)

(52) U.S. Cl.
USPC ............... 438/693; 438/692; 216/88; 216/89; 252/79.1; 252/79.4

(58) Field of Classification Search
USPC .............. 216/88, 89; 438/692, 693; 252/79.1, 252/79.4
See application file for complete search history.

(56) References Cited

U.S. PATENT DOCUMENTS 6,152,148 A * 11/2000 George et al. ............ 134/2
6,200,901 B1 3/2001 Hudson et al.
(Continued)

FOREIGN PATENT DOCUMENTS

EP 1 071 121 A1 1/2001
JP 3172008 3/2001
(Continued)

OTHER PUBLICATIONS

Notification of Reasons for Rejection in corresponding Japanese Application No. 2003-157154 and English translation thereof.
(Continued)

*Primary Examiner* — Shamim Ahmed
(74) *Attorney, Agent, or Firm* — Finnegan, Henderson, Farabow, Garrett & Dunner, LLP

(57) ABSTRACT

There is disclosed a chemical mechanical polishing method of an organic film comprising forming the organic film above a semiconductor substrate, contacting the organic film formed above the semiconductor substrate with a polishing pad attached to a turntable, and dropping a slurry onto the polishing pad to polish the organic film, the slurry being selected from the group consisting of a first slurry and a second slurry, the first slurry comprising a resin particle having a functional group selected from the group consisting of an anionic functional group, a cationic functional group, an amphoteric functional group and a nonionic functional group, and having a primary particle diameter ranging from 0.05 to 5 μm, the first slurry having a pH ranging from 2 to 8, and the second slurry comprising a resin particle having a primary particle diameter ranging from 0.05 to 5 μm, and a surfactant having a hydrophilic moiety.

8 Claims, 13 Drawing Sheets

(56) References Cited

U.S. PATENT DOCUMENTS

| | | |
|---|---|---|
| 6,375,545 B1 | 4/2002 | Yano et al. |
| 6,416,685 B1 | 7/2002 | Zhang et al. |
| 6,443,812 B1 * | 9/2002 | Costas et al. .................. 451/41 |
| 6,464,740 B1 | 10/2002 | Towery et al. |
| 6,528,364 B1 * | 3/2003 | Thakur .......................... 438/239 |
| 6,559,056 B2 | 5/2003 | Hattori et al. |
| 6,568,997 B2 | 5/2003 | Costas et al. |
| 6,582,761 B1 | 6/2003 | Nishimoto et al. |
| 6,638,328 B1 | 10/2003 | Lee et al. |
| 6,641,632 B1 | 11/2003 | Ronay |
| 6,858,539 B2 | 2/2005 | Minamihaba et al. |
| 7,037,839 B2 | 5/2006 | Takayasu et al. |
| 2001/0013507 A1 * | 8/2001 | Hosali et al. .................... 216/89 |
| 2003/0153183 A1 * | 8/2003 | Konno et al. ................. 438/689 |
| 2004/0067652 A1 * | 4/2004 | Takayasu et al. ............. 438/691 |
| 2004/0244300 A1 | 12/2004 | Ichiki et al. |

FOREIGN PATENT DOCUMENTS

| | | |
|---|---|---|
| JP | 2001-131534 | 5/2001 |
| JP | 2001-277105 A | 10/2001 |
| JP | 2001-323256 | 11/2001 |
| JP | 2003-109920 | 4/2003 |
| JP | 2003-109931 | 4/2003 |
| JP | 2003-289055 | 10/2003 |
| JP | 2004-31616 | 1/2004 |
| JP | 2005-14206 | 1/2005 |

OTHER PUBLICATIONS

Notification of Reasons for Rejection in corresponding Japanese Application No. 2004-076408 and English translation thereof.

Third Office Action in corresponding Chinese Application No. 2004100461803 and an English language translation thereof.

Notification of Release of Pre-Trial Examination issued by the Japanese Patent Office on Feb. 19, 2008, for Japanese Patent Application No. 200476408, and English-language translation thereof.

Kashiwagi, "Science of CMP," Science Forum (Aug. 20, 1997), pp. 272-283.

* cited by examiner

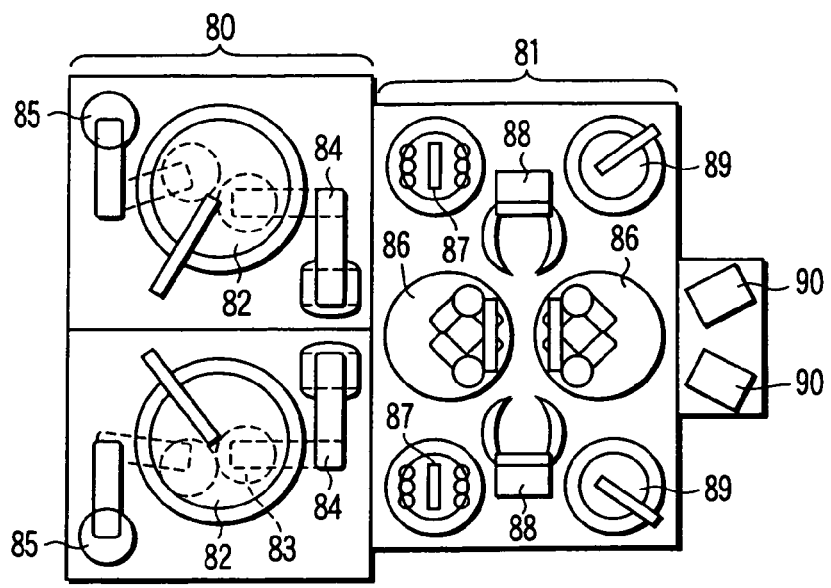
F I G. 19
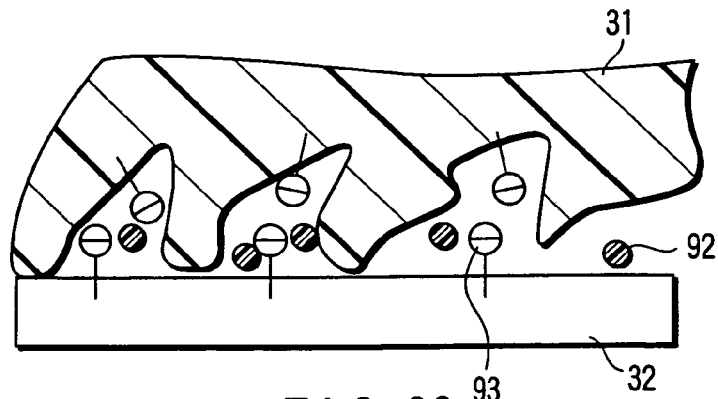
F I G. 20
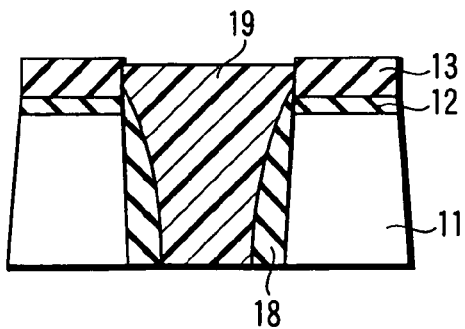
F I G. 21
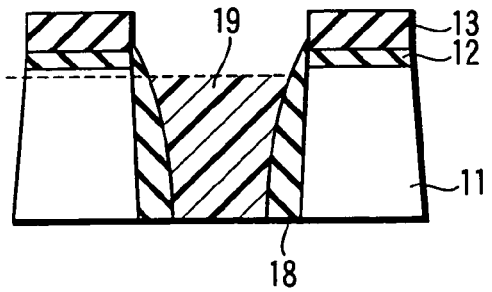
F I G. 22

CHEMICAL MECHANICAL POLISHING METHOD OF ORGANIC FILM AND METHOD OF MANUFACTURING SEMICONDUCTOR DEVICE

CROSS-REFERENCE TO RELATED APPLICATIONS

This application is a divisional of application Ser. No. 10/855,529, filed May 28, 2004, which is now U.S. Pat. No. 7,452,819, and is based upon and claims the benefit of prior Japanese Patent Applications No. 2003-157154, filed Jun. 2, 2003; and No. 2004-076408, filed Mar. 17, 2004, the entire cntents of all of which are incorporated herein by reference.

BACKGROUND OF THE INVENTION

1. Field of the Invention

The present invention relates to chemical mechanical polishing of an organic film such as a resist film, and a method of manufacturing a semiconductor device.

2. Description of the Related Art

In the process of manufacturing a semiconductor device, a photoresist film is employed as an expendable film for fabricating a desired structure. For example, after trenches have been formed in a semiconductor substrate or after holes have been formed in an insulating film, a photoresist is coated to form an expendable film. Then, the expendable film is subjected to a recessing process or a peeling process to obtain a desired structure. This kind of process has been employed for forming a buried strap for electrically connecting a storage node electrode with a diffusion layer of a cell transistor in the manufacture of a semiconductor memory provided with a trench capacitor. Further, this kind of process is also useful in a process of preliminarily forming a via-hole (via first DD) in the process of forming a Cu dual damascene structure (Cu DD structure).

In either of the cases, the film thickness of the photoresist film is required to be uniform throughout the entire surface of wafer. However, when a resist is applied to a region where trenches and holes are formed in a pattern of high density so as to bury these trenches and holes with the resist, the volume of the resultant resist film diminishes at such a region of high pattern density. Therefore, there will be generated a large magnitude of non-uniformity in thickness, e.g., of the order of several hundreds of nanometers, between the film thickness of the resist film located over a region of high pattern density and the film thickness of the resist film located over a region of low pattern density or over a field region.

This non-uniformity in film thickness of the resist film will be further enlarged in a subsequent recessing, thereby degrading the configuration of device. Additionally, this non-uniformity in film thickness of the resist film would become a cause for decreasing the depth of focus or for reducing device yield.

With a view to overcoming these problems resulting from the aforementioned non-uniformity in film thickness of the resist film, there has been proposed to a method for flattening the photoresist by chemical mechanical polishing (CMP) after finishing the coating of the resist. However, the application of CMP to a photoresist film has been found to have the following problems.

Namely, conventional CMP for polishing a photoresist film is accompanied with problems that it takes a relatively long time for polishing the photoresist film and that the stability in terms of polishing time is poor. These problems will become more conspicuous especially when a resist film of large thickness, e.g., 3 μm, is subjected to CMP. More specifically, the polishing of such a resist film will take as long as 200 to 270 seconds and stability in terms of polishing time will also be poor.

Moreover, it will be difficult to suppress the dishing, and the surface of wafer that has been polished will be poor in uniformity. If the in-plane uniformity of the wafer is poor, it will become invite non-uniformity in depth of the recesses to be subsequently formed, thereby making it difficult to obtain a uniform and desired in-plane configuration of the wafer. For example, the existence of non-uniformity in depth of the recesses on forming a buried strap will become a direct cause for non-uniformity of collar oxide film, resulting in non-uniformity in electrical resistance of the buried strap.

On polishing a resist film whose hardness has been increased through the baking thereof at a high temperature, inorganic particles such as silica and alumina are employed as an abrasive grain to secure a practical process margin and productivity. In this case, the inorganic particles tend to remain in the trenches, thereby raising problems that the surface condition of the wafer is degraded and that the residual inorganic particle will become a mask in the recessing step subsequent to the CMP step.

BRIEF SUMMARY OF THE INVENTION

A chemical mechanical polishing method of an organic film according to one aspect of the present invention comprises forming the organic film above a semiconductor substrate; contacting the organic film formed above the semiconductor substrate with a polishing pad attached to a turntable; and dropping a slurry onto the polishing pad to polish the organic film, the slurry being selected from the group consisting of a first slurry and a second slurry, the first slurry comprising a resin particle having a functional group selected from the group consisting of an anionic functional group, a cationic functional group, an amphoteric functional group and a nonionic functional group, and having a primary particle diameter ranging from 0.05 to 5 μm, the first slurry having a pH ranging from 2 to 8, and the second slurry comprising a resin particle having a primary particle diameter ranging from 0.05 to 5 μm, and a surfactant having a hydrophilic moiety.

A chemical mechanical polishing method of an organic film according to another aspect of the present invention comprises forming the organic film above a semiconductor substrate; contacting the organic film formed above the semiconductor substrate with a polishing pad attached to a turntable; subjecting the organic film to a first polishing by feeding a dispersion containing a resin particle having a primary particle diameter ranging from 0.05 to 5 μm to the polishing pad; and subjecting the organic film to a second polishing subsequent to the first polishing by feeding a solution containing a surfactant having a hydrophilic moiety to the polishing pad.

A method of manufacturing a semiconductor device according to a one aspect of the present invention comprises forming a concave portion in an underlying layer, the underlying layer being a semiconductor substrate or an insulating film deposited above the semiconductor substrate; forming a resist film above the underlying layer where the concave portion is formed; subjecting the resist film to a chemical mechanical polishing to selectively leave the resist film inside the concave portion, the chemical mechanical polishing being performed by contacting the resist film formed above the semiconductor substrate with a polishing pad attached to a turntable; and dropping a slurry onto the polishing pad to polish the resist film, the slurry being selected from the group consisting of a first slurry and a second slurry, the first slurry comprising a resin particle having a functional group selected from the group consisting of an anionic functional group, a cationic functional group, an amphoteric functional group and a nonionic functional group, and having a primary particle diameter ranging from 0.05 to 5 µm, the first slurry having a pH ranging from 2 to 8; and the second slurry comprising a resin particle having a primary particle diameter ranging from 0.05 to 5 µm, and a surfactant having a hydrophilic moiety; and recessing the resist film buried in the concave portion to a predetermined depth.

A method of manufacturing a semiconductor device according to another aspect of the present invention comprises forming a hole in an insulating film which is deposited above a semiconductor substrate; forming a first resist film above the insulating film where the hole is formed; subjecting the first resist film to a chemical mechanical polishing to selectively leave the first resist film inside the hole, the chemical mechanical polishing being performed by contacting the first resist film formed above the semiconductor substrate with a polishing pad attached to a turntable; and dropping a slurry onto the polishing pad to polish the first resist film, the slurry being selected from the group consisting of a first slurry and a second slurry, the first slurry comprising a resin particle having a functional group selected from the group consisting of an anionic functional group, a cationic functional group, an amphoteric functional group and a nonionic functional group, and having a primary particle diameter ranging from 0.05 to 5 µm, the first slurry having a pH ranging from 2 to 8; and the second slurry comprising a resin particle having a primary particle diameter ranging from 0.05 to 5 µm, and a surfactant having a hydrophilic moiety; forming a second resist film above the first resist film after chemical mechanical polishing; forming an intermediate layer above the second resist film; forming a third resist film above the intermediate layer; and subjecting the third resist film to pattern exposure.

BRIEF DESCRIPTION OF THE SEVERAL VIEWS OF THE DRAWING

FIG. 19 is a plan view schematically illustrating the construction of polishing apparatus;

FIG. 20 is a cross-sectional view schematically illustrating a state of the polishing pad and wafer during the polishing according to one embodiment of the present invention;

FIG. 21 is a cross-sectional view of the resist film during the polishing according to one embodiment of the present invention;

FIG. 22 is a cross-sectional view of the resist film after finishing the recessing of the resist film;

DETAILED DESCRIPTION OF THE INVENTION

Figure 1:
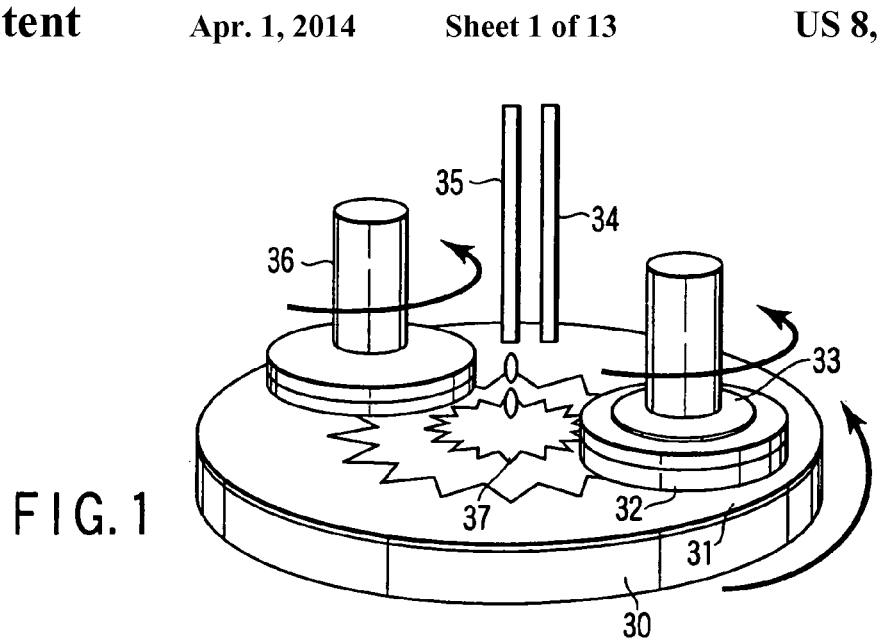
FIG. 1 is a perspective view schematically illustrating a state of CMP.

Next, the embodiments of the present invention will be explained with reference to drawings.

For the chemical mechanical polishing of an organic film according to one embodiment of the present invention, a first or a second slurry having the following features is employed.

The first slurry comprises a resin particle having a functional group selected from the group consisting of an anionic functional group, a cationic functional group, an amphoteric functional group and a nonionic functional group, the primary particle diameter thereof ranging from 0.05 µm to 5 µm, and the pH of the first slurry ranging from 2 to 8.

As for the resin particle, it is possible to employ a resin selected from the group consisting of methacrylic resin such as PMMA (polymethyl methacrylate), PST (polystyrene) resin, urea resin, melamine resin, polyacetal resin and polycarbonate resin. Among them, PMMA and PST resin are more preferable as these resins have a suitable degree of hardness and elasticity for CMP.

If the primary particle diameter of the resin particle is less than 0.05 µm, the resin particle is inclined to enter into a concave to be filled with an organic film, i.e. a trench formed in a semiconductor substrate or a hole formed in an insulating film, thereby most likely enlarging the dishing. On the other hand, if the primary particle diameter of the resin particle becomes larger than 5 µm, it would become difficult to control the dispersibility of the resin particle, most likely causing the slurry to sediment. Accordingly, in the case of the first slurry, the primary diameter of the resin particle should preferably be confined within the range of 0.05 µm to 5 µm. More preferably, the primary diameter of the resin particle should be confined within the range of 0.1 µm to 3.0 µm. The primary diameter of the resin particle can be measured by dynamic or static light scattering method.

At least one functional group selected from the group consisting of an anionic functional group, a cationic functional group, an amphoteric functional group and a nonionic functional group is introduced onto the surface of the resin particle. As for the anionic functional group, it is possible to employ, for example, carboxylic acid type, sulfonic acid type, sulfate type, phosphate type functional groups, etc. As for the cationic functional group, it is possible to employ, for example, amine salt type, quaternary ammonium salt type functional groups, etc. As for the amphoteric functional group, it is possible to employ, for example, alkanol amide type, carboxy betaine type, glycine type functional groups, etc. As for the nonionic functional group, it is possible to employ, for example, ether type, ester type functional groups, etc. Among them, carboxyl group is especially preferable as the employment of carboxyl group makes it possible to easily manufacture the resin particle.

In order to allow the resin particle to stably disperse, the absolute value of ζ-potential should preferably be higher than a predetermined value. More specifically, the absolute value of ζ-potential should preferably be about 20 mV or more. This range of ζ-potential can be realized by setting the ratio of the functional group to about 0.05 mol/L or more. Under some circumstances, two or more functional groups may be concurrently existed. When a functional group exists on the surface of the resin particle, it is possible to enhance the dispersibility of the resin particle through an electric repulsive force among the resin particles without necessitating the addition of a surfactant.

For example, in the case of the resin particle having, on the surface thereof, carboxyl group (COOH) as a functional group, the carboxyl group dissociates in slurry as indicated by: $COOH \rightarrow COO^- + H^+$, thereby allowing the surface of the resin particle to negatively electrify. As a result, due to the electric repulsive force, the flocculation among the resin particles is prevented, thus making it possible to enhance the dispersibility of the resin particle and hence to prolong the life of the slurry to be obtained.

The PMMA particle having, on the surface thereof, carboxyl group (COOH) can be synthesized for example by the following procedures. First of all, methylmethacrylate, methacrylic acid, divinyl benzene, ammonium lauryl sulfate and ammonium persulfate are placed together with a sufficient volume of ion-exchange water in a flask. The resultant mixture is allowed to polymerize for 6-8 hours with stirring in a nitrogen gas atmosphere and at a temperature of 70-80° C. As a result, it is possible to obtain PMMA particle having carboxyl group on the surface thereof and a primary particle diameter ranging from 0.15-0.25 µm. It is possible, through the modification of reaction temperature and time, and other manufacturing conditions, to control the primary particle diameter of the resin particle to fall within the range of 0.05-5 µm.

It is possible to obtain the first slurry by dispersing the resin particle having the aforementioned functional groups on the surface thereof in water. As for the water, it is possible to employ ion-exchange water, pure water, etc. The resin particle is dispersed so as to obtain a concentration of preferably about 0.01 to 30 wt % of the resin particle in slurry. If the concentration of the resin particle is less than 0.01 wt %, it would become difficult to polish the organic film at a sufficiently high polishing rate. On the other hand, if the concentration of the resin particle exceeds 30 wt %, it may become difficult to secure a satisfactory selective ratio thereof relative to an insulating film such as SiN, $SiO_2$, etc., in which the organic film is buried.

The slurry may further contain, if required, an additive such as an oxidizing agent, an organic acid or a surfactant, wherein the quantity of the additive may be such that is commonly employed.

However, the pH of the first slurry is confined within the range of 2 to 8. When the pH of the first slurry is less than 2, the functional group such as COOH hardly dissociate, thereby degrading the dispersibility of the resin particles. If the pH of the first slurry is larger than 8, chemical damage to the organic film such as the resist film would be increased to enlarge the magnitude of dishing.

The pH of the first slurry can be adjusted to the aforementioned range by suitably incorporating a pH adjuster. As for the pH adjuster, it is possible to employ nitric acid, phosphoric acid, hydrochloric acid, sulfuric acid, and citric acid, etc.

Since the first slurry contains a resin particle of a predetermined particle diameter, the first slurry is suited for use in the chemical mechanical polishing of an organic film. In particular, since the resin particle is provided, on the surface thereof, with a functional group, it is possible to enhance the dispersibility of the resin particle by the electric repulsive force among the resin particles without necessitating the addition of a surfactant. The assuring of dispersibility of the resin particle is a very important factor in terms of improving the polishing property and also storage stability of the slurry. Namely, if the resin particle is not dispersed sufficiently, coarse particles would generate, thus giving rise to the generation of scratches. Additionally, the poor dispersibility of the resin particle would render the slurry to become a hard cake, thereby deteriorating the storage stability of the slurry. Whereas, according to this first slurry, since the resin particle is provided, on the surface thereof, with a functional group, there is no possibility of raising the aforementioned undesirable problems in the case of the first slurry.

Moreover, since the pH of the first slurry is confined within a predetermined range, the organic film to be polished can be prevented from being chemically damaged, and also the functional group existing on the surface of the resin particle can be sufficiently dissociated.

The polishing of the organic film according to one embodiment of the present invention can be performed as follows. Namely, as shown in FIG. 1, while rotating a turntable 30 having a polishing pad 31 attached thereto at a speed of 10-50 rpm, a top ring 33 holding a semiconductor substrate 32 is allowed to contact with the turntable 30 at a polishing load of 200-600 $gf/cm^2$ for example. The rotational speed of the top ring 33 can be set to 5-60 rpm. However, it is preferable to determine the rotational speed of the turntable 30 and the top ring 33 in such a way that the relative rotational speed of the semiconductor substrate 32 to that of the polishing pad 31 can be confined within the range of 0.17 to 1.06 m/sec as explained in detail hereinafter. Slurry 37 is fed onto the polishing pad 31 from a first supply nozzle 35 at a flow rate of 100-300 cc/min. Incidentally, FIG. 1 also shows a second supply nozzle 34 and a dresser 36. In this case, the second supply nozzle 34 is employed for feeding water.

As for the polishing pad 31, it is preferable to employ a hard polishing pad having a compression modulus ranging from 100 to 600 MPa. When the compression modulus of the polishing pad is less than 100 MPa, it may not be possible to mechanically remove the resist film to be polished as the hardness of the polishing pad would become smaller than the hardness of the resist film. On the other hand, if the compression modulus of the polishing pad is higher than 600 MPa, the scratches would be likely to generate on the surface of the organic film after finishing the polishing. Therefore, it is preferable to employ IC1000 (trademark; RODEL NITTA Co., Ltd.) whose compression modulus is 290 MPa or so. This IC1000 may be sustained on Suba 400 (trademark; RODEL NITTA Co., Ltd.) having a compression modulus of 6 MPa or less. However, when a soft pad having a compression modulus of 6 MPa or less such as Suba 400 or Politex is employed singly, it may not be possible to completely eliminate the resist film even if the polishing of 120 sec is performed by using the first slurry, it may not be possible to completely eliminate the resist film.

When the first slurry is employed for polishing under the aforementioned conditions, the effects thereof would become especially prominent, thereby making it possible to stably perform the polishing of an organic film such as a resist film within a short period of time without giving rise to the deterioration in surface configuration of the organic film such as dishing.

On the other hand, the second slurry comprises a resin particle having a primary particle diameter ranging from 0.05 μm to 5 μm, and a surfactant having a hydrophilic moiety.

Because of the reasons as already explained above, the primary particle diameter of the resin particle is confined within the range of 0.05 μm to 5 μm. With respect to the resin to be employed herein, they are the same as those to be employed in the first slurry. Especially, the employment of PMMA or PST is more preferable as these resins have a suitable degree of hardness and elasticity for carrying out the CMP. Further, in order to enhance the dispersibility of the resin particle, the resin particle may be provided, on the surface thereof, with a functional group. As for the functional group, those as explained with respect to the first slurry can be employed.

Since the resin particle to be included in the second slurry has a primary particle diameter which is larger than the diameter of the concave portion such as the aforementioned trench, the resin particle can be prevented from entering into the trench during the polishing of an organic film such as a resist film and hence the generation of dishing can be suppressed. Moreover, since the resin particle is made of the same kind of resin as that of the resist film, even if the resin particle is left on the surface of wafer, the resin particle can be easily removed in a subsequent drying step (resist-recessing step). Furthermore, since the polishing rate of the inorganic insulating film such as an SiN film in which the resist is filled is very small, it is possible to secure a high selectivity ratio.

On the other hand, the surfactant comprises a hydrophilic moiety, which is capable of adhering onto the surfaces of polishing pad and wafer as well as onto shavings of the resist during the polishing process, thereby enabling the surfactant to function to provide these surfaces and shavings with hydrophilicity. For example, the hydrophilic moiety of the surfactant may be constituted by any one selected from the group consisting of an anionic functional group, a cationic functional group, an amphoteric functional group and a nonionic functional group. Specifically, the hydrophilic moiety may be carboxylic acid type, sulfonic acid type, sulfate type or phosphate type. As for the surfactant having an anionic hydrophilic moiety, it is possible to employ ammonium polycarboxylate, ammonium dodecylbenzene sulfonate, etc. As for the surfactant having a cationic hydrophilic moiety, it is possible to employ cetyltrimethyl ammonium chloride, dialyldimethyl ammonium chloride, etc. As for the surfactant having a nonionic hydrophilic moiety, it is possible to employ acetylene diol-based surfactant, silicone-based surfactant, etc. It is also possible to use a surfactant having an amphoteric hydrophilic moiety.

The second slurry can be prepared by dispersing the aforementioned resin particle and surfactant in water. As for the water, it is possible to employ ion-exchange water, pure water, etc. For the same reason as explained with reference to the first slurry, the resin particle should preferably be dispersed so as to obtain a concentration of about 0.01 to 30 wt % of the resin particle in slurry. Further, the mixing ratio of the surfactant to the slurry should preferably be confined within the range of 0.01 to 10 wt %, more preferably 0.1 to 3 wt %. If the content of the surfactant in the slurry is less than 0.01 wt %, it would be impossible to sufficiently adhere the surfactant onto the substrate or the polishing pad, thus making it difficult to discharge the shavings. On the other hand, if the content of the surfactant exceeds 10 wt %, the viscosity of the resultant slurry would become too high, thereby giving rise to the clogging of pipes and difficulty in handling of the slurry.

The slurry may further contain, if required, an additive such as an oxidizing agent, an organic acid and a pH adjuster, wherein the quantity of the additive may be such that is commonly employed.

The resin particle and the surfactant are not necessarily required to be incorporated in advance in water. Namely, the second slurry may be prepared over the polishing pad on the occasion of performing the CMP of an organic film. In this case, a dispersion containing the aforementioned resin particle is fed, together with a solution containing the surfactant, onto the polishing pad, thereby mixing the dispersion with the solution over the polishing pad. As for the dispersion of the resin particle, it is possible to employ a slurry which is available in the market such as RST-01 (available from JSR). In this case, the dispersion as well as the solution described above should preferably be supplied by suitably controlling the concentrations and flow rates of these materials in such a way that the contents of these components in the chemical mechanical polishing slurry for forming the organic film are confined within the aforementioned ranges after the mixing of them.

Next, by specific examples, the embodiments of present invention will be explained in detail as follows.

(Embodiment I)

By following the procedures described below, the first slurry was prepared and the polishing of an organic film was performed.

Slurry (I-1):

First of all, 92 parts by weight of styrene, 4 parts by weight of methacrylic acid, 4 parts by weight of hydroxyethylacrylate, 0.1 parts by weight of ammonium lauryl sulfate, 0.5 parts of ammonium persulfate and 400 parts of ion-exchange water were placed in a 2 L flask. The resultant mixture was allowed to polymerize for 6 hours with stirring in a nitrogen gas atmosphere and at a temperature of 70° C. As a result, it was possible to obtain PST particle having carboxyl group, the primary particle diameter thereof being 0.2 μm.

This PST particle was then dispersed in pure water to obtain a 1 wt % solution thereof. Thereafter, nitric acid is added to the solution to adjust the pH thereof to 3, thus obtaining a slurry (I-1).

Slurry (I-2):

First of all, 94 parts by weight of methylmethacrylate, 1 part by weight of methacrylic acid, 5 parts by weight of hydroxymethylmethacrylate, 0.03 parts by weight of ammonium lauryl sulfate, 0.6 parts of ammonium persulfate and 400 parts of ion-exchange water were placed in a 2 L flask. The resultant mixture was allowed to polymerize for 6 hours with stirring in a nitrogen gas atmosphere and at a temperature of 70° C. As a result, it was possible to obtain PMMA particle having carboxyl group, the primary particle diameter thereof being 0.3 μm.

This PMMA particle was then dispersed in pure water to obtain a 1 wt % solution thereof. Thereafter, phosphoric acid is added to the solution to adjust the pH thereof to 3, thus obtaining a slurry (I-2).

All of these slurries contain resin particle having a functional group on the surface thereof and a primary particle diameter ranging from 0.05 to 5 μm, the pH thereof being controlled within the range of 2 to 8. Therefore, these slurries are capable of polishing an organic film such as a resist film within a short period of time without giving rise to the deterioration in configuration of the surface of the organic film after finishing the polishing thereof.

(Embodiment I-1)

In this embodiment, there is explained a process for forming a buried strap which electrically connect a storage node electrode with the diffusion layer of cell transistor.

FIGS. 2A to 2I illustrate a method of forming the buried strap.

Figure 2A:
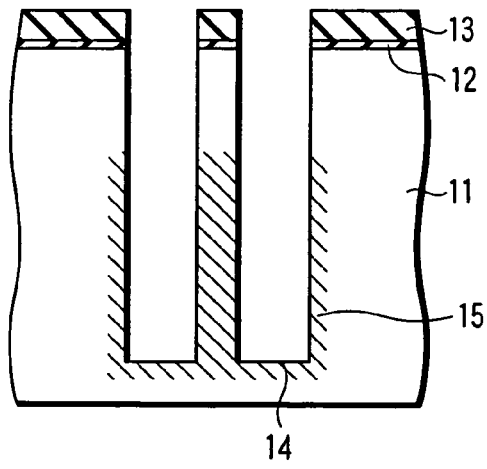
FIGS. 2A to 2I are cross-sectional views each illustrating, stepwise, the method of manufacturing a semiconductor device according to one embodiment of the present invention.
Figure 2B:
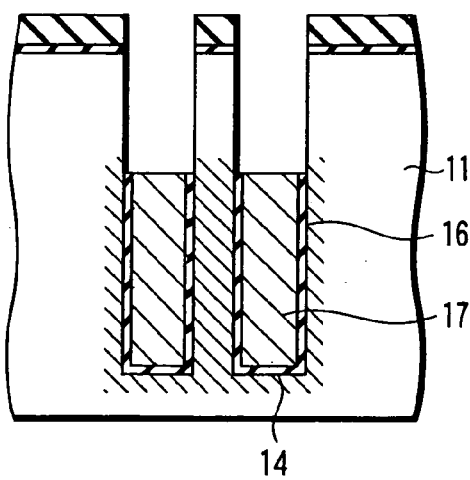

First of all, as shown in FIG. 2A, a semiconductor substrate 11 having a Pad oxide film 12 and a Pad nitride film 13 deposited thereon successively is treated to form trenches 14 by a photolithography and dry etching. Then, a lower peripheral portion of each of the trenches are selectively treated so as to diffuse n-type impurity to form a buried plate electrode 15.

Then, a capacitor dielectric film 16 is deposited on the inner peripheral wall of the buried plate electrode 15. Further, an As-doped polysilicon film (hereinafter referred to as storage node) 17 for forming a storage node electrode is deposited on the capacitor dielectric film 16. As a result, the trenches 14 are filled with this storage node 17. Then, the storage node 17 is etched back to a predetermined depth, and part of the capacitor dielectric film 16 which is located at an upper portion of the side wall of each of the trenches 14 is etched away by using a solution of $H_3PO_4$ for example to obtain a structure shown in FIG. 2B. Thereafter, a thermal oxide film (not shown) is formed on the semiconductor substrate.

Figure 2C:
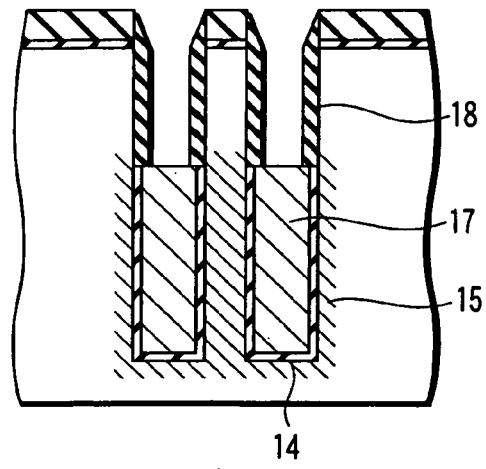

Further, as shown in FIG. 2C, a collar oxide film 18 is deposited on an upper portion of the inner wall of the trenches 14, i.e. a portion which is not covered by the storage node 17. This collar oxide film 18 electrically insulates the buried plate electrode 15 from a diffusion layer (not shown) of a cell transistor. Thereafter, in order to electrically contact the storage node 17 with a polysilicon film (to be discussed hereinafter), a portion of the collar oxide film 18 located over the storage node is removed by a dry etching method.

Figure 2D:
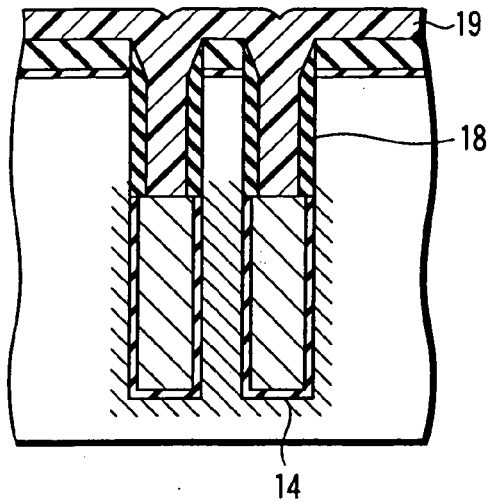
Figure 2E:
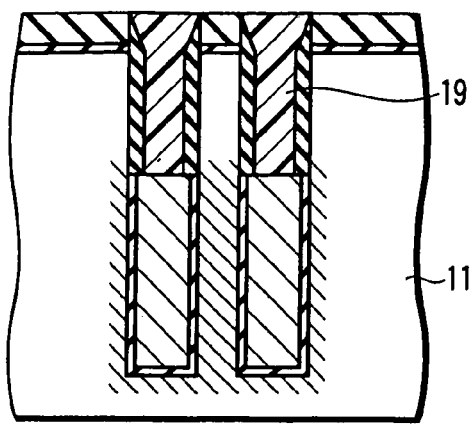

Subsequently, as shown in FIG. 2D, a resist film 19 is deposited all over the entire surface and then, subjected to CMP to flatten the surface to expose the surface of the Pad nitride film 13 as shown in FIG. 2E. The polishing of the resist film 19 is performed by using the method according to this embodiment of the present invention.

More specifically, by using IC1000 (trademark; RODEL NITTA Co., Ltd.) as a polishing pad and the first slurry, the polishing of the resist film 19 is performed as follows. Namely, as shown in FIG. 1, while rotating a turntable 30 having a polishing pad 31 attached thereto at a speed of 30 rpm, a top ring 33 holding a semiconductor substrate 32 is allowed to contact with the turntable 30 at a polishing load of 500 gf/cm². The rotational speed of the top ring 33 is set to 32 rpm, and slurry 37 is fed onto the polishing pad 31 from a slurry supply nozzle 35 at a flow rate of 150 cc/min. As for the slurry, the aforementioned slurry (I-1) is employed. Since the diameter of each of the trenches formed in the substrate is 0.14 μm, the diameter of the primary particle of the resin particle included in the slurry is about 140% as large as the diameter of the trench.

Figure 2H:
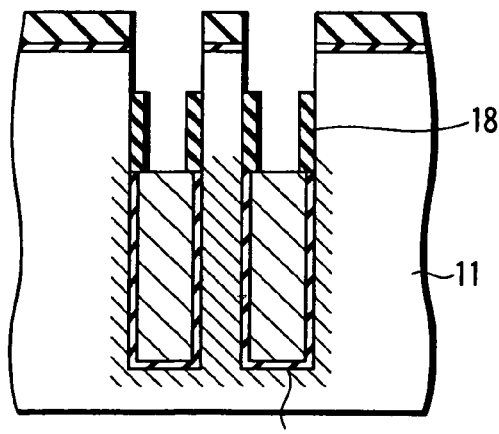
Figure 2F:
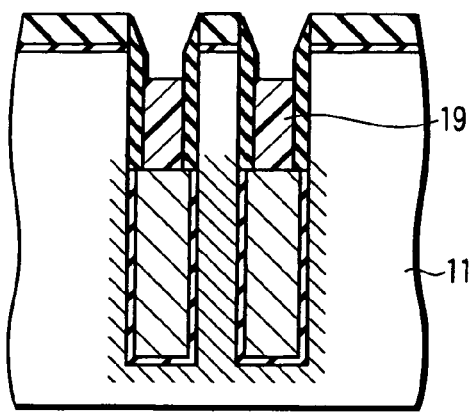

Then, as shown in FIG. 2F, the resist film 19 is recessed by CDE (Chemical Dry Etching) to a depth required for making contact with the diffusion layer (not shown) of cell transistor.

Figure 2I:
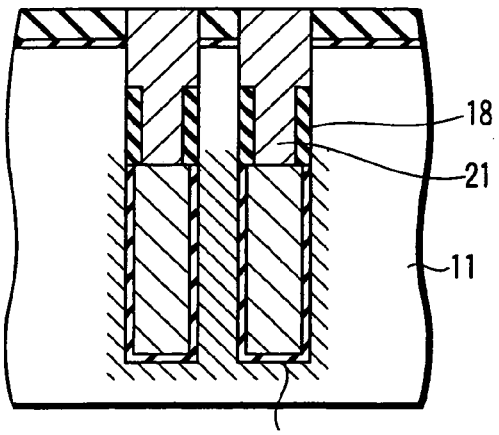
Figure 2G:
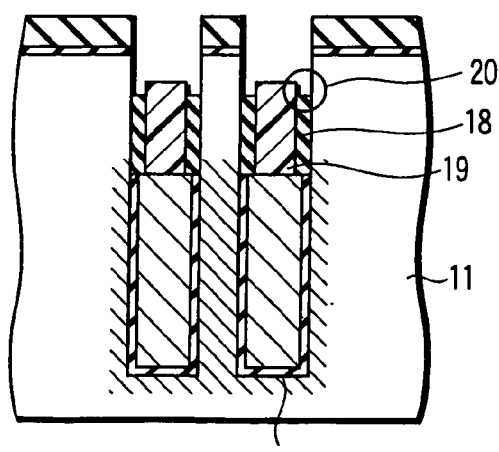

By using a wet etching method, a portion of the collar oxide film 18 is removed as shown in FIG. 2G to expose a portion of the semiconductor substrate 11 within the trenches 14. The top surface of the collar oxide film 18 is now located lower than the top surface of the resist film 19 as shown in FIG. 2G, thereby forming an opening 20 for the buried strap.

After the resist film 19 has been removed as shown in FIG. 2H, in order to enable the diffusion layer (not shown) of cell transistor to make contact with the storage node 17, a polysilicon film 21 is deposited as shown in FIG. 2I. In this manner, the opening 20 for the buried strap is filled with this polysilicon film 21, thereby forming the buried strap.

According to this embodiment, since the recessing is performed subsequent to the flattening of the resist film 19, the resist film 19 can be recessed while assuring the uniformity of the depth thereof. Accordingly, there is little possibility of generating non-uniformity in film thickness of the collar oxide film upon finishing the etchback treatment Any non-uniformity in film thickness of the collar oxide film may become a cause for generating the non-uniformity of electric resistance of the buried strap, thereby deteriorating the device yield. Therefore, it is considered necessary to suppress the non-uniformity in thickness of the collar oxide film to 30 nm or less.

Conventionally, the etchback of the collar oxide film has been performed by recessing without flattening in advance of the resist film. In this case, since a resist enters into the trench, fluctuations in thickness of coated resist film are caused to generate at the end portion of cell array, thus rendering the thickness of coated resist film to become thinner in the order of: the field portion, the end portion of cell array, and the central portion of cells. For example, a trench having an opening diameter of 0.14 μm and a depth of 1.2 μm is filled with the resist, there will be generated a difference in thickness of about 120 nm between the field portion of the resist film and the central portion of the resist film. As a result, there will be generated a difference in recessed depth of the resist film, resulting in the non-uniformity in film thickness of the collar oxide film at the moment of finishing the etchback treatment. More specifically, a non-uniformity of 30 nm or so generates in the thickness of the collar oxide film, thereby making the process inoperable.

In this embodiment however, since the surface of the resist film is flattened prior to the recessing step by CMP so as to make the resist film uniform in thickness, it is now possible to suppress the non-uniformity in film thickness of the collar oxide film 18 to 30 nm or less.

Next, the CMP of the resist film according to this embodiment will be explained in detail.

The polishing of the resist film by CMP will undergo by a mechanism which is different from the CMP of metals such as Cu and W. The CMP of metals is generally performed by a process wherein a brittle protective film is formed in advance on the surface of a metallic film to be polished, and then, by using abrasive grain made of inorganic particle, the surface of the metallic film is removed. Whereas, in the case of the CMP of resist, the resist film is peeled away by mechanical polishing force of the polishing pad or abrasive grain, thereby mainly removing the resist film. In the case of CMP where the mechanical factor is very strong, it is very important, for the purpose of achieving a high polishing rate, to maintain a high friction between the wafer and the polishing pad.

In the ordinary CMP such as $SiO_2$-CMP, the surface of the polishing pad as well as the polishing surface are both hydrophilic. Therefore, the frictional coefficient between these surfaces during the polishing is confined within the boundary lubrication region of so-called Stribeck diagram irrespective of the rotational speed of the polishing pad and relative velocity of the wafer. Incidentally, if the rotational speed of the wafer ω is equal to the rotational speed of the polishing pad Ω, the relative velocity (v) of the wafer can be given by the product of the distance R between the center of table and the center of wafer and the rotational speed Ω of the polishing pad (v=RΩ). Therefore, according to the ordinary formula of Preston, the polishing rate is more likely to increase as the rotational speed of the polishing pad is increased.

Figure 3:
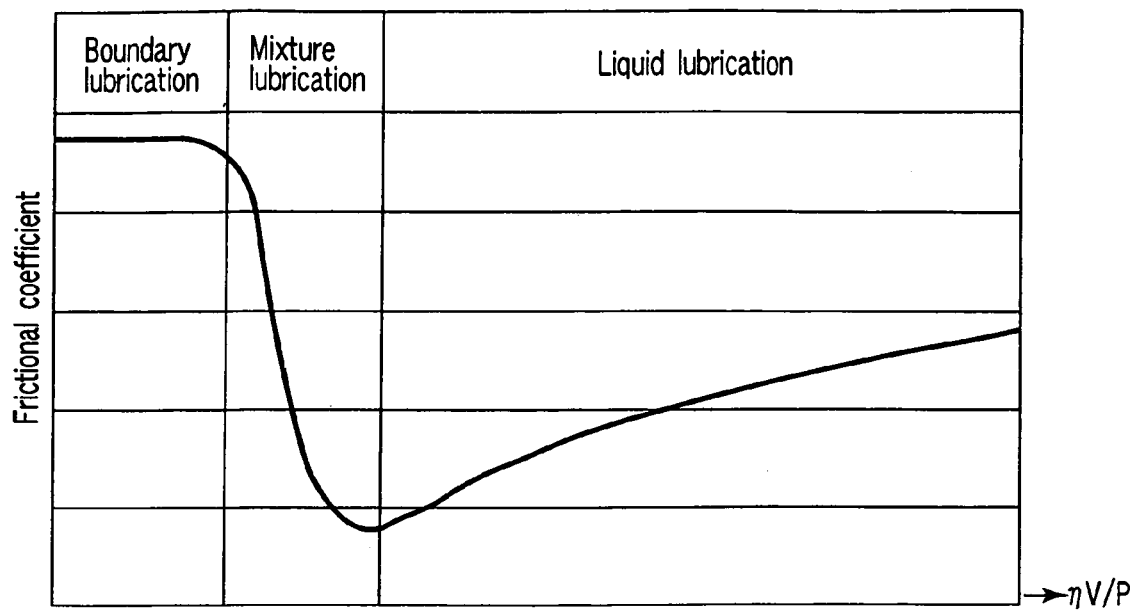
FIG. 3 is a graph showing a Stribeck diagram.

Next, this phenomenon will be explained with reference to the Stribeck diagram shown in FIG. 3. In the graph of FIG. 3, the abscissa represents a load characteristic and the ordinate represents a frictional coefficient (arbitrary unit).

In the case of $SiO_2$ for example, a region where the rotational speed of the polishing pad is confined within the range of as wide as 10 to 100 rpm corresponds to the boundary lubrication region. Therefore, if the distance R between the center of table and the center of wafer is 170 mm, the relative velocity of wafer at the aforementioned rotational speeds would become 0.17 m/s and 1.57 m/s, respectively.

Whereas, in the case of CMP for polishing the resist film which is made of a hydrophobic material, the situation becomes quite different, i.e. the lower the relative velocity of wafer is, the higher the polishing rate would become. The reason for this may be attributed to the fact that the surface of the polishing pad is turned to become hydrophobic after finishing the polishing. A lot of flake-like shavings of resist generate on the surface of the polishing pad upon finishing the polishing of the resist film. These shavings accumulate on the surface of the polishing pad as the polishing is repeated, thereby turning the surface of the polishing pad into a hydrophobic surface. As a result, the surface of the polishing pad as well as the surface of wafer are turned to become hydrophobic. Therefore, the relative velocity of the wafer exceeds a certain limit, the frictional coefficient thereof would be sharply decreased. This state is a liquid lubrication region of the Stribeck diagram shown in FIG. 3, wherein the contact between the wafer and the polishing pad becomes almost zero. In this case, the polishing rate of the resist film becomes very small.

In the CMP of resist film, by using a wafer having a diameter of 200 mm, the influence of the relative velocity of wafer on the state of friction was investigated under the conditions wherein the distance R between the center of table and the center of wafer was set to 170 mm and the rotational speed Ω of the polishing pad was altered. As a result, the rotational speed ranging from 10 to 60 rpm was found to fall within the boundary lubrication region. However, when the rotational speed was exceeded 70 rpm, it was found to fall within the liquid lubrication region. If the CMP of resist film is to be achieved within the boundary lubrication region, the relative velocity of wafer (v) is required to be confined within the range of 0.17 to 1.06 m/sec.

Figure 4:
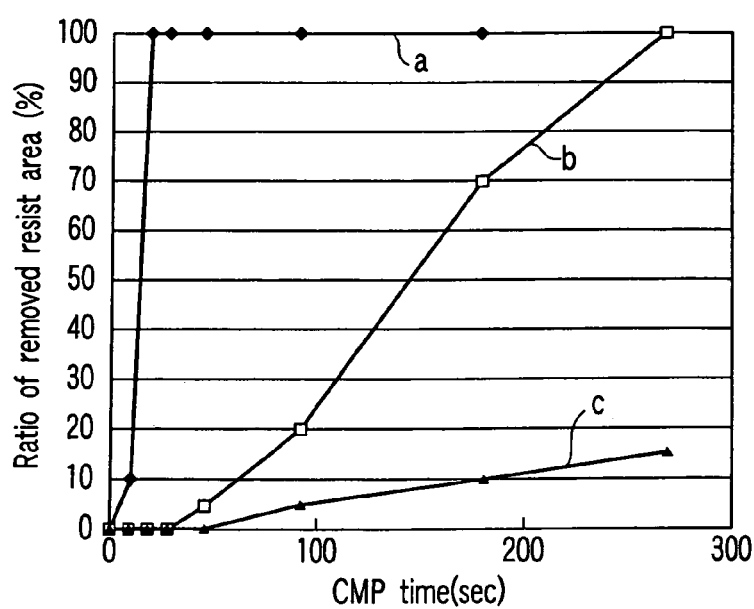
FIG. 4 is a graph illustrating the relationship between the time of CMP and the ratio of removed resist area.

FIG. 4 is a graph illustrating the relationship between the time of CMP and the ratio of removed resist area. By "the ratio of removed resist area", it is intended to mean such that a state where the resist film is existed the entire surface of substrate before CMP is defined as 0%, whereas a state where the resist film is completely removed from the surface of substrate after finishing the CMP is defined as 100%. Herein, the investigation was performed using a resist film having a thickness of 3 μm. In the graph shown in FIG. 4, the results obtained from three kinds differing in relative velocity of wafers were illustrated. The curves "a", "b" and "c" show results where the relative velocity of wafer was set to 0.53 m/s, 1.24 m/s and 1.57 m/s, respectively. The rotational speed of the polishing pad at each of these relative velocities of wafer was set to 30 rpm, 70 rpm and 100 rpm, respectively. As described above, when the CMP of resist film was performed at a rotational speed of 70 rpm or more, i.e. at a relative velocity of 1.24 m/s or more, the state of CMP was found to fall within the liquid lubrication region and hence the frictional coefficient was minimized. Therefore, it will take a long period time of as long as 270 sec or more for accomplishing the CMP as shown by the curve "b", thus indicating very slow polishing rate.

Whereas, when the CMP was performed at a rotational speed of 30 rpm, i.e. at a relative velocity of 0.53 m/s, the state of CMP was found to fall within the boundary lubrication region and hence it was possible to maintain a high frictional coefficient. Namely, as shown by the curve "a", the polishing was accomplished within a short period of only 20 sec or so.

Incidentally, as shown by the curve "c", when the relative velocity was 1.57 m/s, the ratio of removed resist area was limited to about 15% or so even if the polishing was performed for a time period of 270 seconds.

Figure 5:
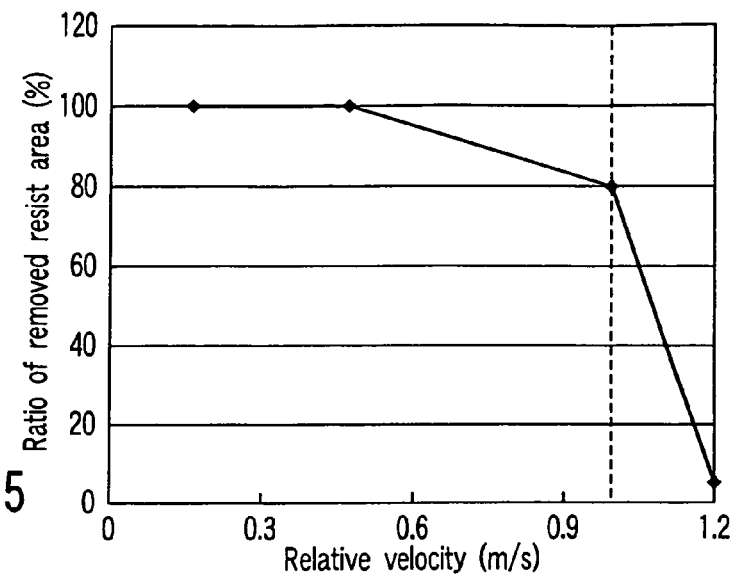
FIG. 5 is a graph illustrating the relationship between the relative velocity and the ratio of removed resist area.

The graph of FIG. 5 illustrates the relationship between the relative velocity and the ratio of removed resist area where the polishing was performed for a period of 45 seconds. As long as the relative velocity is confined within the range of 0.17 to 1.06 m/sec, it is possible to achieve a ratio of removed resist area of as high as 80% or more by continuing the polishing for 45 seconds.

Figure 6:
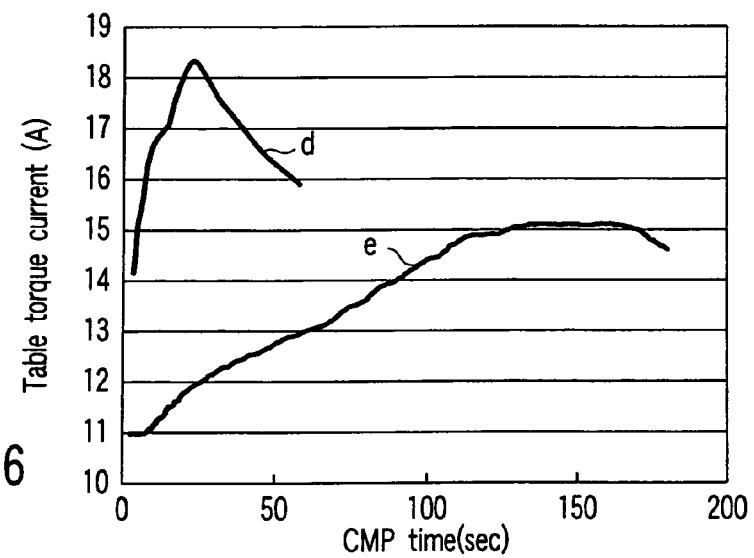
FIG. 6 is a graph illustrating the relationship between the time of CMP and the table torque current.

Further, the graph of FIG. 6 illustrates the relationship between the time of CMP and the table torque current. The curve "d" shows the result obtained as the relative velocity was set to 0.53 m/s (rotational speed: 30 rpm), the curve "e" shows the result obtained as the relative velocity was set to 1.24 m/s (rotational speed: 70 rpm). As shown by the curve "d", when the relative velocity is set to 0.53 m/s, it is possible to obtain a table torque current of more than 18 A within a polishing time of only 25 seconds. There is a positive correlation between this table torque current and the friction between wafer/polishing pad, so that the polishing time on this occasion was so excellent in stability that even if the polishing was performed for about 20 wafers, the polishing time was maintained at a constant of 60 seconds or so.

By contrast, when the relative velocity was 1.24 m/s, the table torque current was limited to about 15 A even if the polishing was performed for a time period of 180 seconds as shown by the curve "e". In this case, it took a long period of time for accomplishing the polishing and the stability of the polishing time was also found poor. When the polishing was performed for about 20 wafers, the polishing time fluctuated from 200 to 270 seconds.

Incidentally, in order to secure a sufficient polishing speed, the load during the CMP should preferably be confined within the range of 200 to 600 $gf/cm^2$. If the load is lower than 200 $gf/cm^2$, the state of CMP would be inclined to fall within the liquid lubrication region of Stribeck diagram, thereby making it difficult to maintain the friction. On the other hand, if the load is higher than 600 $gf/cm^2$, it may become difficult to feed the slurry to the polishing surface, and the polishing rate would be deteriorated and at the same time, the magnitude of scratches may be increased.

The particle diameter of the resin particle in the first slurry should preferably be determined depending on the diameter of the opening of the trench in which resist is introduced. Followings are discussions with respect to the particle diameter of the resin particle.

Figures 7A, 7B:
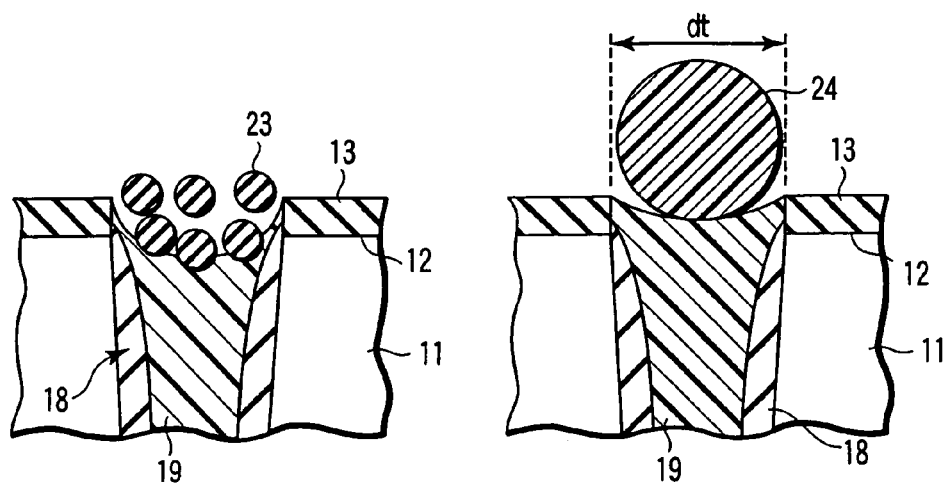
FIGS. 7A and 7B are cross-sectional views each illustrating a state of abrasive grain existing at the trench portion.

FIGS. 7A and 7B illustrate a state of abrasive grain existing at the trench portion. In this case, the diameter ($d_t$) of the opening of the trench is set to 2 μm.

For example, when a slurry containing 1 wt % of silica particle having a primary particle diameter of 0.035 μm is employed as a slurry, the size of the silica particle is much smaller than the diameter of the trench. Therefore, as shown in FIG. 7A, the silica particle 23 enters into the trench, thereby proceeding the dishing. On the other hand, when the resin particle of somewhat large size is employed, the resin particle is prevented from entering into the trench as shown in FIG. 7B, so that it is possible to prevent the generation of dishing.

Figure 8:
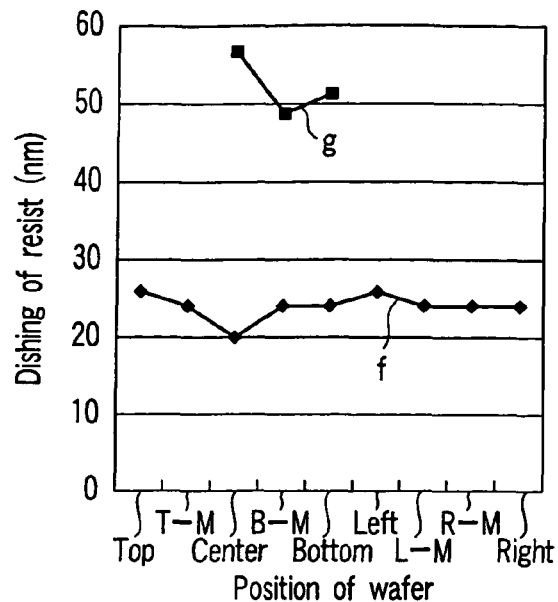
FIG. 8 is a graph illustrating the relationship between the location of a wafer and the magnitude of dishing.

The graph of FIG. 8 illustrates the relationship between the position of a wafer and the magnitude of dishing at each of the situations shown in FIGS. 7A and 7B. In FIG. 8, the curves "f" and "g" illustrate the states shown in FIGS. 7B and 7A, respectively. As indicated by the curve "g", when silica particle having a smaller particle diameter is employed, the magnitude of the dishing would exceed 50 nm and the in-plane uniformity thereof would become poor. Furthermore, since the configuration of dishing is distorted, the configuration thereof after the recessing process would be also degraded. Moreover, the silica particle that has entered into the trench would hardly be removed therefrom, thus rendering the particle to remain in the trench. In this case, the residue of the silica particle would become a mask when recessing the resist film, thus giving rise to the non-uniformity in depth of the recess.

On the other hand, when the resin particle having a relatively large diameter is employed, the magnitude of dishing can be suppressed to 25 nm or so as shown by the curve "f". Therefore, even if the resin particle is happen to be left remain inside the trench, since the resin particle is formed of the same material as that of the resist, the resin particle can be removed from the trench by recessing. Therefore, the risk that may be caused due to the residue of resin particle would be minimal. Furthermore, there is an advantage that since the polishing force of the resin particle against the SiN film is very small, the polishing rate of SiN would be suppressed to 1/10 as compared with that of silica particle.

Figure 9:
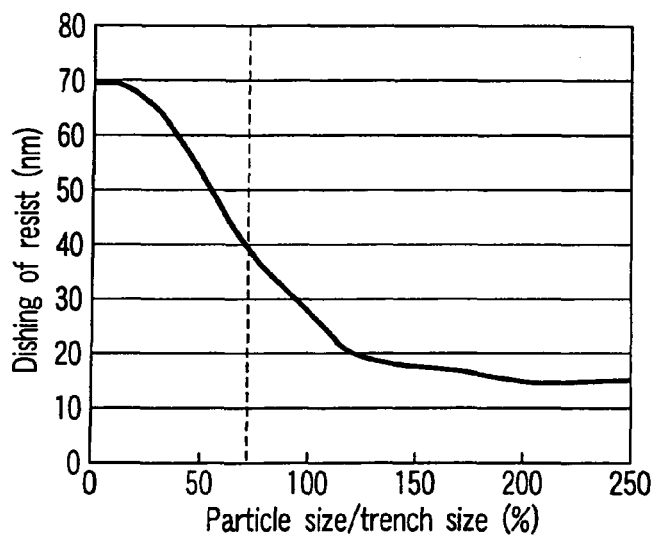
FIG. 9 is a graph illustrating the relationship between the ratio of particle size/trench size and the magnitude of dishing.

FIG. 9 illustrates the relationship between the ratio of particle size/trench size and the magnitude of dishing. If the dishing is confined at most to 40 nm or so, the wafer would not be substantially affected by such a dishing. Accordingly, the ratio of particle size/trench size should preferably be set to 70% or more. If the ratio of particle size/trench size becomes larger than 200%, the magnitude of dishing would be limited to a constant level of about 15 nm. Because of the same reason as explained above, the primary particle diameter of the resin particle is limited to at most 5 μm. Taking these facts into consideration, the upper limit of the ratio of particle size/trench size should preferably be determined.

Figure 10:
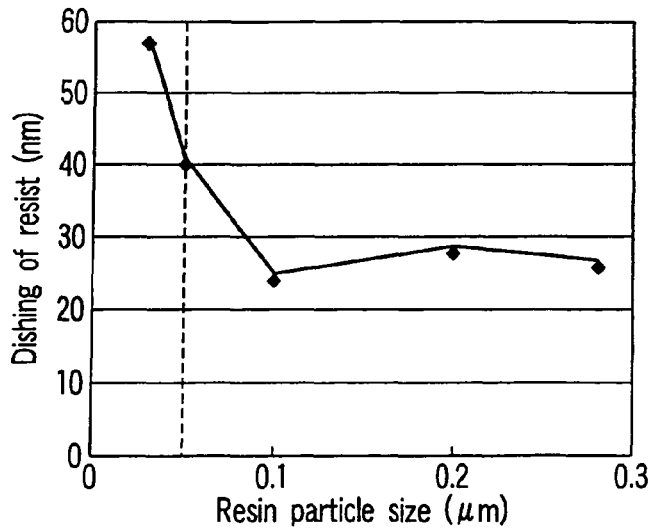
FIG. 10 is a graph illustrating the relationship between the size of abrasive grain and the magnitude of dishing.

FIG. 10 illustrates the relationship between the size of resin particle and the magnitude of dishing. The size referred to herein is the primary particle diameter, so that if this size is 0.05 μm or more, the magnitude of dishing can be suppressed to 40 nm or less.

As described above, it is possible, through the employment of this first slurry, to form within a short period of time a buried resist structure which is minimal in dishing and non-uniformity of dishing. Therefore, when this first slurry is applied to the formation of the buried strap, it is possible to extremely minimize the non-uniformity in electric resistance of the strap.

Incidentally, the polishing method according to one embodiment of the present invention is applicable not only to the photoresist film but also to an organic film such as an organic SOG.

(Embodiment I-2)

In this embodiment, the formation of wiring pattern in the process of forming a Cu dual damascene (DD) wiring, in particular, in the process of preliminary formation of via-hole will be explained.

FIGS. 11A to 11G are cross-sectional views each illustrating, stepwise, the method of forming a wiring pattern where a multilayer resist method was employed in the DD process for the preliminary formation of via-hole.

Figure 11A:
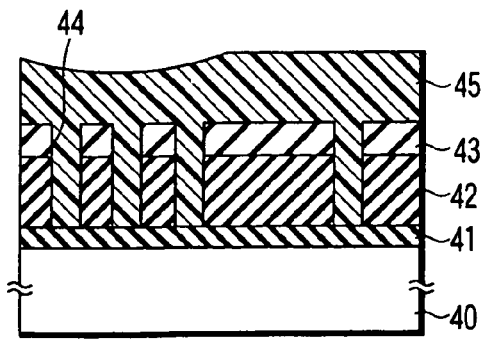
FIGS. 11A to 11G are cross-sectional views each illustrating, stepwise, the method of forming a wiring pattern where a multilayer resist method was employed.

First of all, as shown in FIG. 11A, a stopper film 41, a first insulating film 42 and a second insulating film 43 are successively deposited on a semiconductor substrate 40 by CVD method or spin-coating method. The semiconductor substrate 40 is provided in advance with semiconductor elements and a lower wiring (not shown). Holes 44 are formed in the first insulating film 42 as well as in the second insulating film 43 by RIE method. Then, a first resist film 45 is deposited the entire surface. This first resist film 45 is useful as an etching mask and as an anti-reflection layer.

Figure 11B:
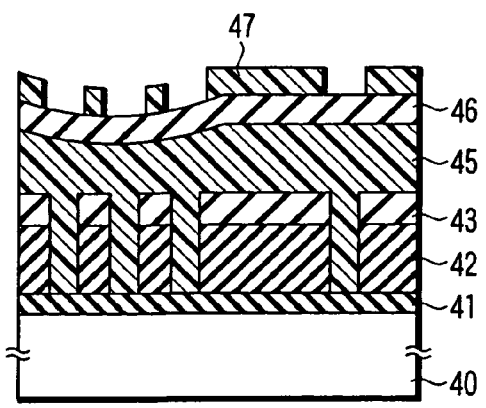

On this first resist film 45, an intermediate layer 46 made of SOG or $SiO_2$ and a second resist film 47 are successively formed and then, the second resist film 47 is patterned as shown in FIG. 11B by lithography.

Figure 11C:
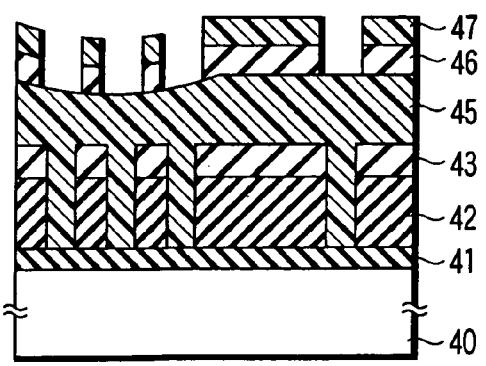
Figure 11D:
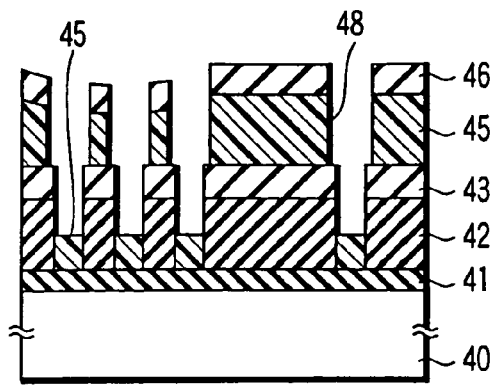

Then, by using halogen gas for instance, the intermediate layer 46 is worked as shown in FIG. 11C by dry etching. Thereafter, by using oxygen gas for instance, the first resist film 45 is etched as shown in FIG. 11D. On this occasion, the second resist film 47 located on the intermediate layer 46 is concurrently etched away.

Figure 11E:
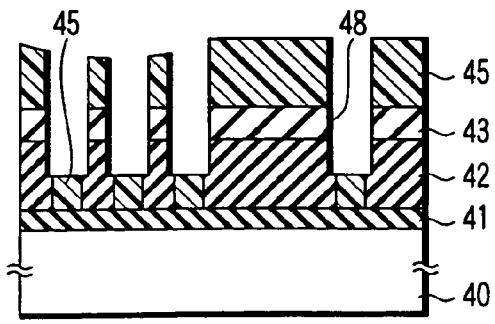
Figure 11F:
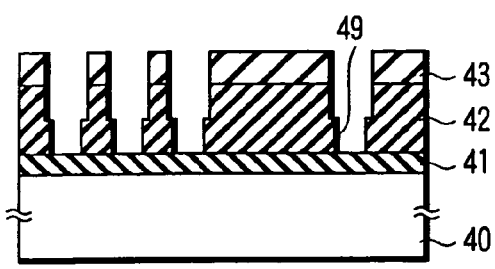

Subsequently, the etching of wiring grooves 48 is performed as shown in FIG. 11E. On this occasion, the intermediate layer 46 is concurrently etched away. Thereafter, the first resist film 45 buried in the hole is peeled away together with the first resist film 45 located on the second insulating film 43 to form a via-hole 49 as shown in FIG. 11F.

Figure 11G:
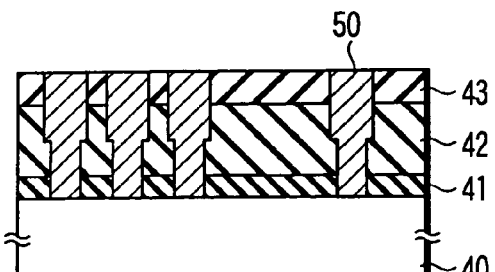

After the stopper film 41 existing inside the via-hole 49 is removed, a Cu film is formed by a plating method or a sputtering method with a barrier metal film (not shown) made of TaN for instance being interposed therebetween. Further, by CMP, part of Cu located over the field region is removed to form a Cu dual damascene (DD) wiring having a Cu wiring 50 as shown in FIG. 11G.

According to this conventional method, the resist is absorbed by a pattern having a high density of via-hole (hereinafter referred to as a dense via portion) when forming the first resist film 45, thereby giving rise to the generation of non-uniformity in film thickness of the first resist film 45. More specifically, there is a non-uniformity of 100 nm or so between the film thickness of the resist film disposed over the dense via portion and the film thickness of the resist film disposed over the field portion or over a pattern having a low density of via-hole (hereinafter referred to as a non-dense via portion). This difference in film thickness cannot be alleviated even by the intermediate layer 46 and the second resist film 47 both formed over the first resist film 45. Rather, this difference in film thickness is inclined to increase due to these layer and film by a magnitude of 30 nm.

Figure 12A:
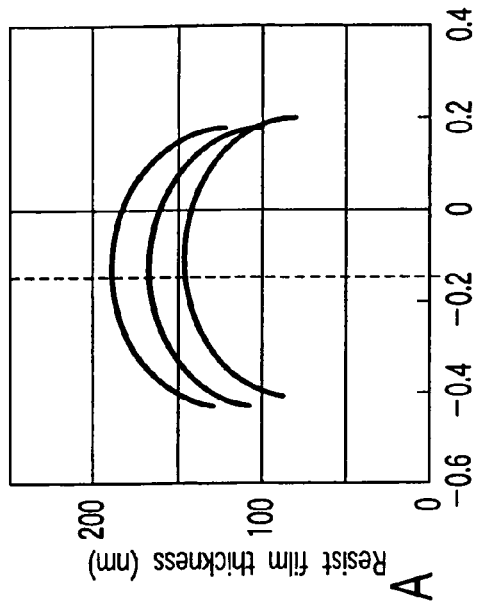
FIGS. 12A and 12B respectively shows a graph illustrating the dependency of the film thickness of resist on the focus.
Figure 12B:
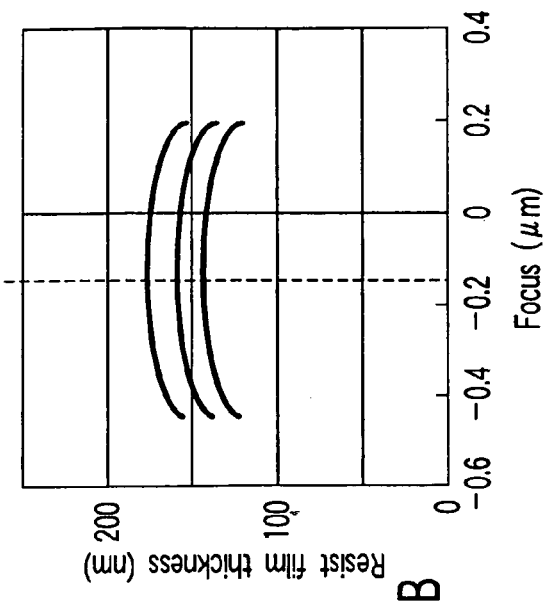

As a result, it becomes impossible to make the best focus of the dense via portion coincide with that of the non-dense via portion on the occasion of performing the patterning of the resist film, i.e. the best focus is caused to shift by about 0.1 μm from each other. FIGS. 12A and 12B respectively illustrates the dependency of the film thickness of resist on the focus.

Figure 13A:
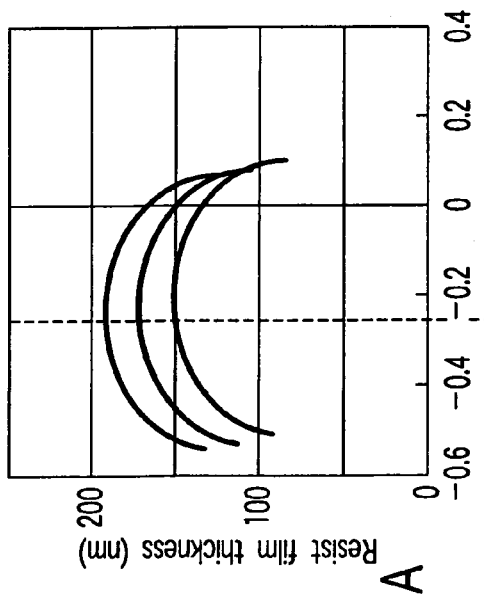
FIGS. 13A and 13B respectively shows a graph illustrating the dependency of the film thickness of resist on the focus.
Figure 13B:
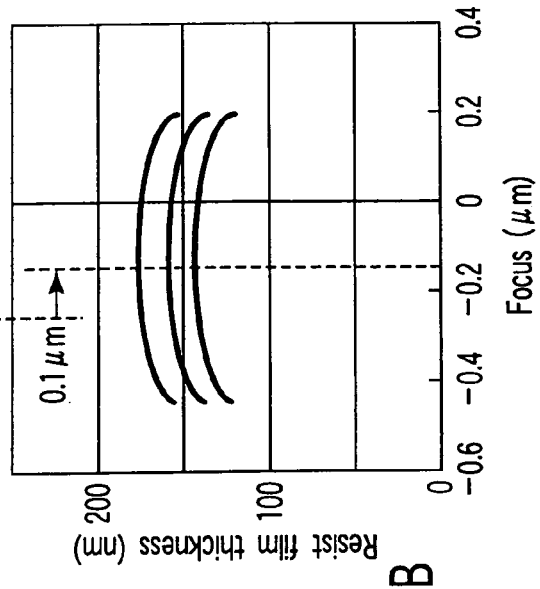

Specifically, FIGS. 12A and 12B show the focus dependency of the film thickness of resist at the non-dense via portion (0.14 μm/15 μm) and the dense via portion (0.14 μm/0.14 μm), respectively. These graphs show the results obtained from three kinds of light exposure, which are represented by three curves corresponding respectively, from the upper line down to the lower line, to 45 mJ/cm$^2$, 41 mJ/cm$^2$ and 37 mJ/cm$^2$ in exposure. Namely, irrespective of the magnitude of exposure, there is a shift of 0.1 μm in best focus between the non-dense via portion and the dense via portion. This magnitude of difference corresponds to a difference in film thickness of the resist film. Incidentally, as long as there is no via-hole (reference process), there is no difference in film thickness of the resist film, there will be recognized no pattern dependency of best focus as shown in FIG. 13A (non-dense via portion) and FIG. 13B (dense via portion).

Figure 14C:
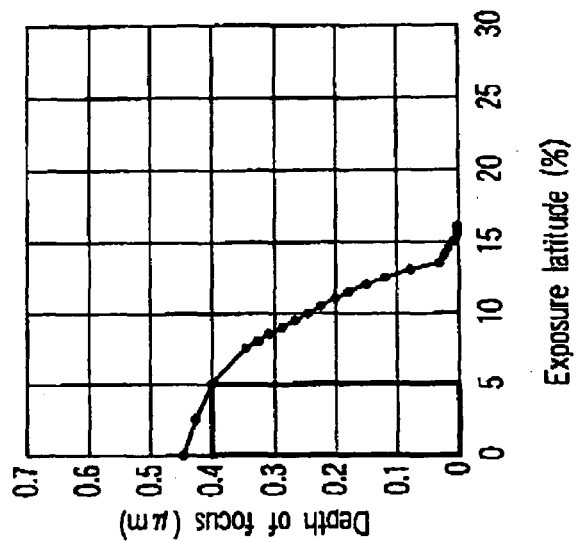
FIGS. 14A to 14C are graphs each showing a margin curve.
Figure 14B:
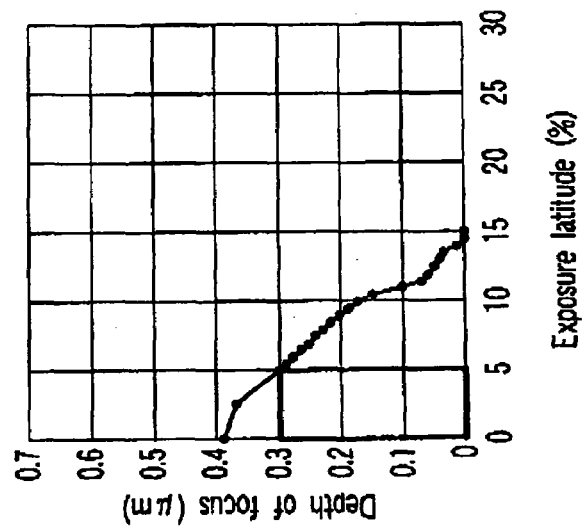
Figure 14A:
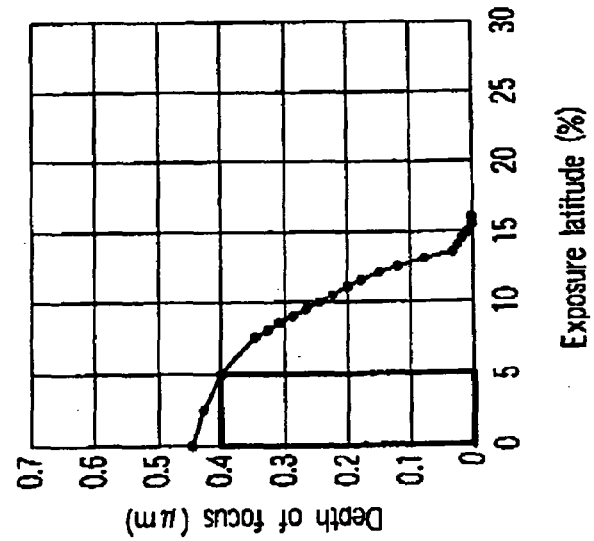

Then, ED Tree analysis was performed to obtain margin curves as shown in FIGS. 14A to 14C. FIGS. 14A and 14B illustrate the results obtained from the reference process and the prior art, respectively. Further, the result obtained from the embodiment to be discussed hereinafter is shown in FIG. 14C. When comparison was made with respect to the depth of focus at an exposure latitude of 5%, while the depth of focus was 0.3 μm in the case of the prior art as shown in FIG. 14B, the depth of focus in the case of the reference process was 0.4 μm as shown in FIG. 14A. According to the prior art, the depth of focus at an exposure latitude of 5% is decreased by 0.1 μm, thus reducing the process margin.

In this embodiment, after the formation of the first resist film 45, the CMP thereof is performed to flatten the first resist film 45 so as to make the first resist film 45 uniform in film thickness. Thereafter, the second resist film, the intermediate layer and the third resist film are successively formed to alleviate any difference in film thickness, thus minimizing the decrease of the depth of focus that may be caused due to the density of via-hole.

Figure 15A:
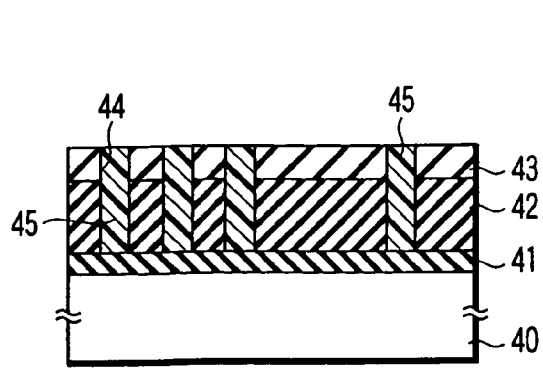
FIGS. 15A and 15B are cross-sectional views each illustrating, stepwise, part of the method of manufacturing a semiconductor device according to another embodiment of the present invention.
Figure 15B:
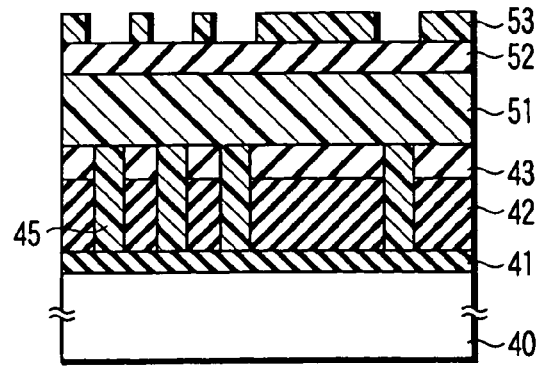

FIGS. 15A and 15B are cross-sectional views each illustrating, in stepwise, part of the method of manufacturing a semiconductor device according to this embodiment.

First of all, as shown in FIG. 15A, a stopper film 41 formed of SiC and having a thickness of 50 nm was deposited on a semiconductor substrate 40 provided in advance with semiconductor elements and lower wirings (not shown). Then, a first insulating film 42 (Black Diamond; Applied Material Co., Ltd.) having a thickness of 400 nm and a second insulating film 43 (SiO$_2$) having a thickness of 100 nm were successively deposited thereon. Thereafter, a via-hole 44 having an opening diameter of 140 nm was formed in these insulating films. Further, a first resist film 45 having a thickness of 0.3 μm was deposited the entire surface, and a portion of the first resist film 45 which was located over the second insulating film 43 was removed while selectively leaving the first resist film 45 in a hole 44.

The removal of the first resist film 45 which was located over the second insulating film 43 was performed by CMP using the first slurry. More specifically, by using IC1000 (trademark; RODEL NITTA Co., Ltd.) was employed as a polishing pad, and, as shown in FIG. 1, while rotating a turntable 30 having a polishing pad 31 attached thereto at a speed of 30 rpm, a top ring 33 holding a semiconductor substrate 32 was allowed to contact with the turntable 30 at a polishing load of 500 gf/cm$^2$. The rotational speed of the top ring 33 was set to 33 rpm, and slurry 37 was fed onto the polishing pad 31 from a slurry supply nozzle 35 at a flow rate of 150 cc/min. In this case, the relative velocity of wafer was about 0.53 m/s. As for the slurry, the aforementioned slurry (I-1) was employed. In this embodiment, the primary particle diameter of the resin particle included in the slurry was about 140% of the opening diameter of the hole.

As a result of the polishing for 60 seconds, the dishing of resist at the hole 44 having an opening diameter of 0.14 μm was found 10 nm or less, and the loss of the second insulating film 43 was suppressed to almost zero.

Then, as shown in FIG. 15B, by using the aforementioned procedures, a second resist film 51, an intermediate layer 52 and a third resist film 53 were successively deposited, and then, the patterning of the third resist film 53 was performed.

Figure 16A:
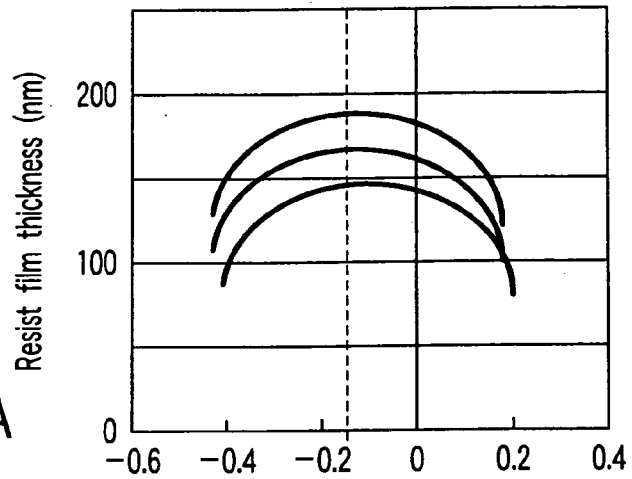
FIGS. 16A and 16B respectively shows a graph illustrating the dependency of the film thickness of resist on the focus.
Figure 16B:
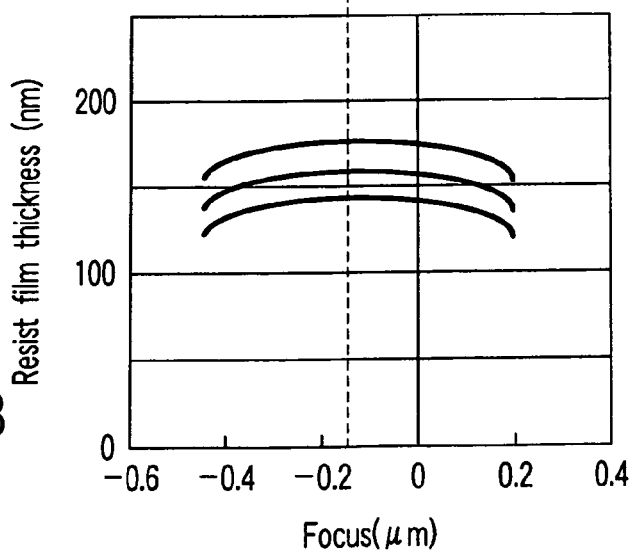

Since the first resist film 45 was flattened in advance by CMP, a difference in film thickness between the dense via portion and the non-dense via portion after the patterning of the resist film was suppressed to almost zero. FIGS. 16A and 16B illustrate the dependency of the resist film at the non-dense via portion and at the dense via portion, respectively, on the light exposure. These FIGS. demonstrate the fact that there was no longer existed any substantial dependency of the best focus on the density of via-hole. The depth of focus at an exposure latitude of 5% was 0.4 μm as shown in FIG. 14C, which was of the same level as that of the reference process. As described above, it is now possible, through the polishing in advance of the resist film to make it uniform in thickness by CMP, to enlarge the focus margin of lithography.

Incidentally, in the ordinary 3-ply resist process, the first resist film is subjected to a pre-baking at a high temperature of 300° C. or more, thereby enhancing the etching resistance of the first resist film. However, due to this high-temperature baking, the hardness of the resist film becomes higher than that of the resin particle and also becomes brittle. As a result, it become impossible to perform the polishing by using the resin particle and the peeling of pad may be caused to occur. It may become possible to perform the polishing of such a hard resist film by using alumina particle as an abrasive grain, which is higher in hardness than that of the resist film that has been baked at a high temperature. However, when a slurry containing an inorganic particle such as alumina is employed, some extent of dishing or risk due to the residue of particles would be inevitably caused to occur.

Therefore, it is preferable to perform the CMP with the first slurry after the first resist film has been subjected in advance to a low temperature baking at a temperature ranging from 100° C. to 200° C., for example 150° C. or so. If this pre-baking temperature is lower than 100° C., the adhesion of the resist may be deteriorated, thereby making it difficult to suppress the peeling at the time of CMP. On the other hand, if this pre-baking temperature is higher than 200° C., the resist film may become harder than the resin particle, thus possibly making it difficult to remove the resist film. Due to this low temperature baking, the first resist film can be removed by using the first slurry. Thereafter, the second resist film is deposited thereon and then, subjected to a high-temperature baking at a temperature ranging from about 300 to 350° C., thereby enhancing the etching resistance thereof. If the temperature of this high-temperature baking is lower than 300° C., it may become difficult to secure the selective ratio at the time of dry etching. On the other hand, if the temperature of this high-temperature baking is higher than 350° C., oxygen is caused dissociated, thereby possibly making it impossible to perform the ashing of resist.

Since the polishing can be performed by using the first slurry containing a resin particle, the dishing on the surface after the polishing thereof can be minimized and also the residue of particles can be prevented from being left unremoved.

(Embodiment I-3)

In this embodiment, the method of forming a Cu dual damascene (DD) wiring by resist-recessing method will be explained.

The conventional method will be explained with reference to FIGS. 17A to 17C.

Figure 17A:
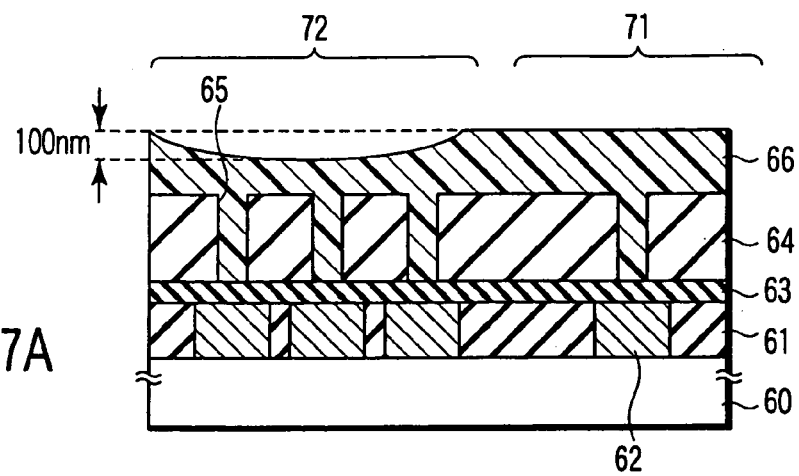
FIGS. 17A to 17C are cross-sectional views each illustrating, stepwise, the process of forming a Cu dual damascene where the recess of resist is employed.

First of all, as shown in FIG. 17A, an insulating film 61 is deposited on a semiconductor substrate 60 provided in advance with semiconductor elements (not shown) and then, a lower Cu wiring 62 is buried. On this resultant surface, a stopper film 63 and an interlayer insulating film 64 are successively deposited, and via-holes 65 are formed in the interlayer insulating film 64 by lithography and dry etching (RIE). Then, a first resist film 66 is deposited the entire surface.

Figure 17B:
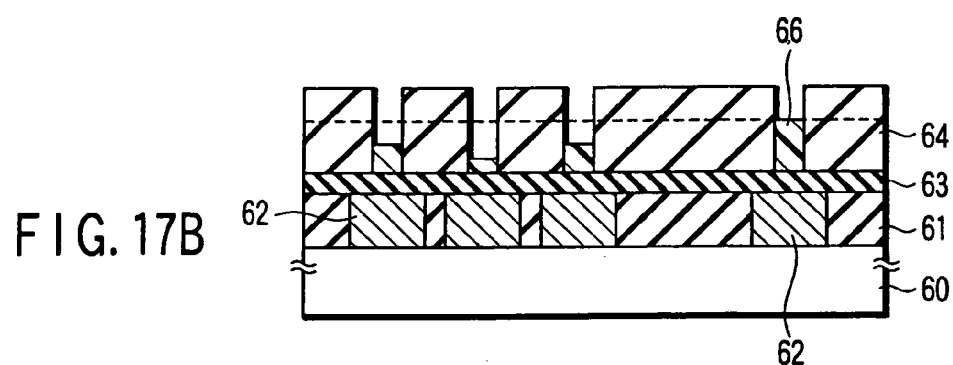

Then, as shown in FIG. 17B, the first resist film 66 is etched back by CDE method, thereby recessing the first resist film 66 down to a predetermined depth.

Figure 17C:
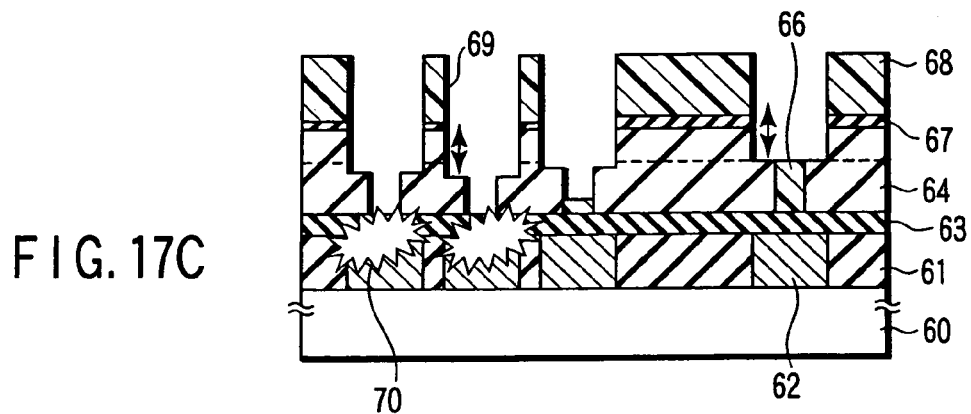

Thereafter, as shown in FIG. 17C, an anti-reflection layer 67 and a second resist film 68 are successively deposited, and the second resist film 68 is patterned to form wiring grooves 69. Further, by RIE, the anti-reflection layer 67 and the insulating film 64 are subjected to etching to form the wiring grooves 69.

Subsequently, the first resist film 66 that has been buried inside the via-holes 65 is removed, and, by the formation of a metallic film and by CMP as explained in Embodiment (I-2), a Cu DD structure is formed.

This conventional procedure is accompanied with the following problems. Namely, when forming the first resist film 66 on the interlayer insulating film 64 having the via-holes 65 formed therein, the resist is consumed by the hole 65. As a result, as shown in FIG. 17A, the film thickness of resist at the dense via portion 72 would become thinner by a thickness of about 100 nm as compared with the film thickness of resist over the non-dense via portion 71 or over the field region.

This non-uniformity in film thickness of resist would be enlarged in the subsequent recessing step, thus making the film thickness of resist minimal at the dense via portion 72 as shown in FIG. 17B.

When working the wiring grooves 69, the first resist film 66 located at the dense via portion 72 is no longer capable of withstanding the working, thereby giving an etching damage 70 to the lower wirings as shown in FIG. 17C. Further, due to the non-uniformity in thickness of the first resist film 66 that has been buried inside the via-hole 65, the anti-reflection layer 67 is also cause to fluctuate in film thickness.

When the anti-reflection layer 67 located at the dense via portion 72 becomes thinner, the over-etching of the dense via portion 72 would occur when etching the anti-reflection layer 67. As a result, the wiring grooves 69 may become deeper at the dense via portion 72 as compared with the wiring grooves 69 located at the non-dense via portion, resulting in the enlargement in non-uniformity of the electric resistance of wirings after the formation of metallic film and the CMP treatment.

In this embodiment, the CMP of resist is performed subsequent to the formation of the first resist film 66, thereby assuring the flatness and hence the uniformity in film thickness of the first resist film 66 before the first resist film 66 is subjected to the recessing step thereof.

FIGS. 18A to 18E are cross-sectional views each illustrating, in stepwise, part of the method of manufacturing a semiconductor device according to this embodiment.

Figure 18A:
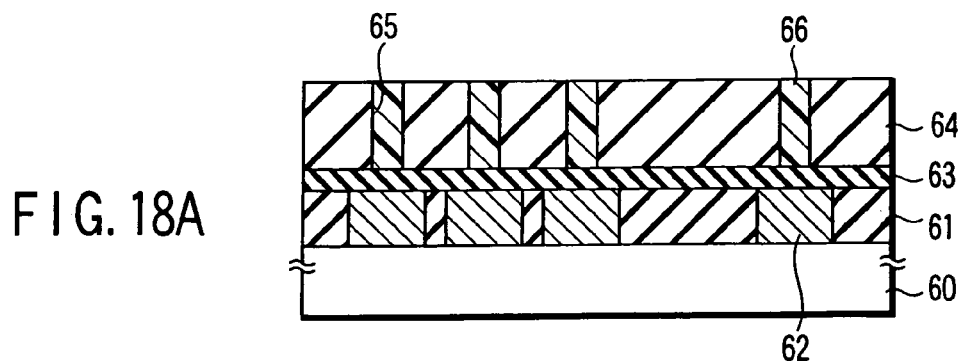
FIGS. 18A to 18E are cross-sectional views each illustrating, stepwise, part of the method of manufacturing a semiconductor device according to a further embodiment of the present invention.

First of all, as shown in FIG. 18A, an insulating film 61 made of $SiO_2$ and having a thickness of 400 nm is deposited on a semiconductor substrate 60 provided in advance with semiconductor elements (not shown) and then, a lower Cu wiring 62 is buried according to the ordinary procedures. On this resultant surface, a stopper film 63 (film thickness: 50 nm) made of SiC and an interlayer insulating film 64 (film thickness: 1 μm) made of $SiO_2$ are successively deposited. Then, via-holes 65 having an opening diameter of 140 nm are formed in the interlayer insulating film 64. Then, a first resist film 66 is deposited the entire surface. Thereafter, the first resist film 66 which is located over the interlayer insulating film 64 is removed, thereby selectively leaving the interlayer insulating film 64 inside the via-holes.

The removal of the first resist film 66 which was located over the interlayer insulating film 64 was performed by CMP using the first slurry. More specifically, by using IC1000/Suba400 (trademark; RODEL NITTA Co., Ltd.) was employed as a polishing pad, and, as shown in FIG. 1, while rotating a turntable 30 having a polishing pad 31 attached thereto at a speed of 30 rpm, a top ring 33 holding a semiconductor substrate 32 was allowed to contact with the turntable 30 at a polishing load of 500 gf/cm². The rotational speed of the top ring 33 was set to 33 rpm, and slurry 37 was fed onto the polishing pad 31 from a first supply nozzle 35 at a flow rate of 150 cc/min. In this case, the relative velocity of wafer was about 0.53 m/s. As for the slurry, the aforementioned slurry (I-2) was employed. In this embodiment, the primary particle diameter of the resin particle included in the slurry was about 210% of the opening diameter of the via-hole.

Figure 18B:
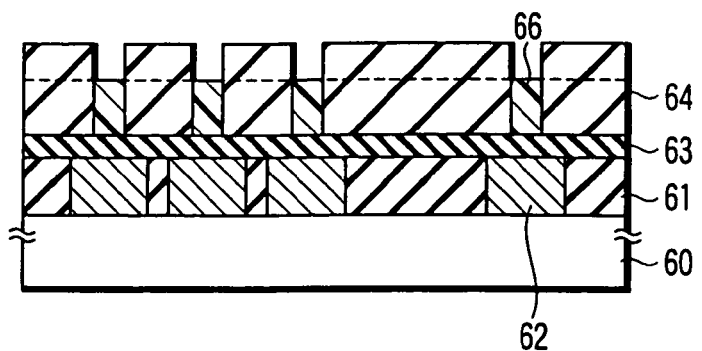

As a result of the polishing for 60 seconds, the dishing of the first resist film 66 was found 10 nm or less, and the loss of the interlayer-insulating film 64 was suppressed to almost zero. Then, the first resist film 66 existing inside the via-holes 65 was etched back, thereby recessing the first resist film 66 to a predetermined depth. The film thickness of the first resist film 66 after finishing this recessing process was substantially uniform as shown in FIG. 18B and the non-uniformity thereof was suppressed to 20 nm or less.

Figure 18C:
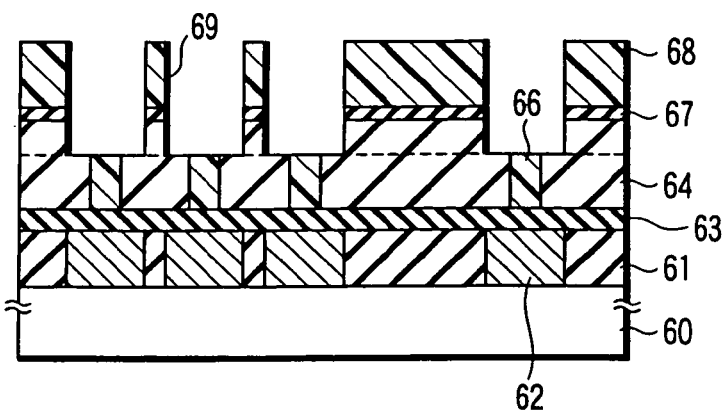

Since the film thickness of the first resist film 66 after finishing the recessing process was substantially uniform, it was possible to form the anti-reflection layer 67 with uniform film thickness as shown in FIG. 18C. Furthermore, a second resist film 68 was deposited thereon, and the second resist film 68, the anti-reflection layer 67 and the interlayer insulating film 64 were patterned to form wiring grooves 69.

Figure 18D:
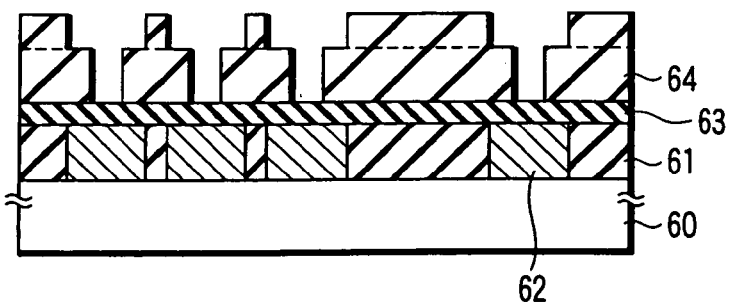
Figure 18E:
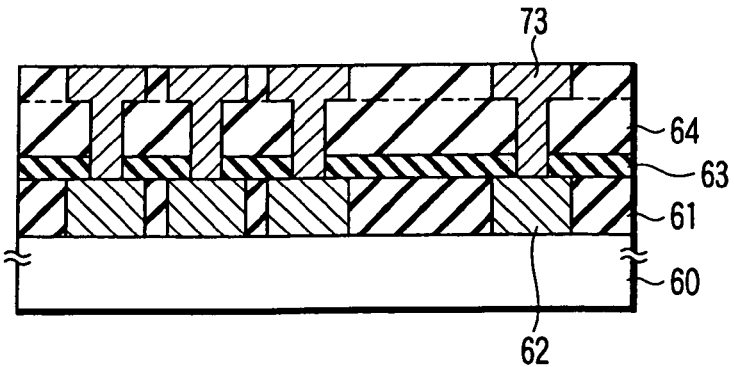

Thereafter, as shown in FIG. 18D, the first resist film 66, the anti-reflection layer 67 and the second resist film 68 were removed. After the stopper film 63 existing inside the via-holes 65 is removed, the wiring grooves 69 and the via-holes 65 were filled with Cu with a barrier metal film (not shown) made of TaN for instance being interposed therebetween. Finally, CMP was performed to obtain Cu DD wirings 73 as shown in FIG. 18E.

Since the first resist film was flattened by CMP prior to recessing thereof, it was possible to greatly minimize any damage to the lower wirings as well as the non-uniformity in depth of the wiring grooves, thus obtaining Cu DD wirings excellent in reliability.

As explained above in detail, it is now possible, through the employment of the first slurry, to suppress the generation of dishing, to maintain excellent surface features, and to stably perform the polishing of an organic film such as a resist film within a short period of time. Furthermore, it is also possible to stably form a resist-buried structure excellent in flatness and in uniformity within a short period of time, thus manufacturing a semiconductor device.

(Embodiment II)

Next, the process of polishing an organic film by using the second slurry will be explained.

(Embodiment II-1)

In this embodiment, the second slurry is employed in the process illustrated with reference to FIGS. 2A to 2I, thereby forming a buried strap for electrically connecting the storage node electrode with the diffusion layer of cell transistor.

By using the second slurry, the surface of the resist film 19 can be flattened without remaining the shavings of resist on the polishing pad. Therefore, there is no possibility of raising inconveniences that may be caused by the generation of shavings such as the clogging of the polishing pad or the adhesion of shavings. Since the resist film is recessed after the aforementioned flattening, the resist film can be recessed uniformly to a predetermined depth throughout the entire surface of wafer. Therefore, it is now possible to prevent the generation of non-uniformity in film thickness of the collar oxide film 18 after finishing the etchback treatment.

Any non-uniformity in film thickness of the collar oxide film may generate the non-uniformity of electric resistance of the buried strap, thereby degrading the device yield. Therefore, it is considered necessary to suppress the non-uniformity in thickness of the collar oxide film to 30 nm or less.

Now, let us consider a situation wherein the surface of the resist film is polished to flatten it without removing the shavings and recessed, and then, the etchback of the collar oxide film is performed. Since the trenches are filled with the resist with the shavings being partially left unremoved, the film thickness of the resist film the entire wafer would become non-uniform. For example, a trench having an opening diameter of 0.14 μm and a depth of 1.2 μm is filled with the resist, there will be generated a difference in thickness of about 200 nm between a region of the resist film where the shavings are left unremoved and a region of the resist film where the shavings are removed. As a result, there will be generated a difference in recessed depth of the resist film, resulting in the non-uniformity in film thickness of the collar oxide film after finishing the etchback treatment. More specifically, a non-uniformity of 50 nm or so generate in the thickness of the collar oxide film, thereby making the process inoperable.

In the polishing according to this embodiment however, since the shavings of resist can be completely removed without remaining them on the resist film, it is possible to ensure clean surface of the resist film 19 before recessing. Therefore, it is now possible to suppress without fail the non-uniformity in film thickness of the collar oxide film 18 to 30 nm or less.

Next, the CMP of the resist film according to this embodiment will be explained in detail.

In this embodiment, the polishing of the resist film was performed by using EPO-222 (Ebara Manufacturing Co., Ltd.) as a CMP apparatus. Namely, as shown in FIG. 1, while rotating a turntable 30 having a polishing pad 31 attached thereto at a speed of 50 rpm, a top ring 33 holding a semiconductor substrate 32 is allowed to contact with the turntable 30 at a polishing load of 500 gf/cm$^2$. As for the polishing pad 31, IC1000 (trademark; RODEL NITTA Co., Ltd.) having a compression modulus of 290 MPa was employed and the top ring 33 was rotated at a rotational speed of 52 rpm.

The dispersion containing the resin particle was fed onto the polishing pad 31 from the first supply nozzle 35 and a solution containing a surfactant was fed onto the polishing pad 31 from the second supply nozzle 34. The dispersion and the solution were mixed with each other over the polishing pad 31 to prepare the second slurry (slurry (II-1)). As for the dispersion, a slurry (RST-01; available from JSR) containing 1 wt % of polystyrene particle having a primary particle diameter of 200 nm was employed and fed to the polishing pad at a flow rate of 150 cc/min. On the other hand, as for the solution containing a surfactant, a 0.15 wt % aqueous solution of polycarboxylic acid was employed and fed to the polishing pad at a flow rate of 100 cc/min. Incidentally, if a slurry containing a resin particle and a surfactant both mixed together in advance is to be employed, only one supply nozzle will be required. After finishing the polishing, water was fed to the polishing pad from a water supply nozzle (not shown) to perform the water-polishing.

In the polishing of the resist film, the polishing pressure to be effected by the contact of the top ring 33 with the polishing pad 31 may be selected within the range of 200 to 600 gf/cm$^2$. The rotational speed of the turntable 30 and the top ring 33 may be suitably selected from the range of 10 to 50 rpm and the range of 5 to 60 rpm, respectively.

FIG. 19 illustrates schematically the structure of the polishing apparatus to be employed in the method according to one embodiment of the present invention. The polishing apparatus shown herein is of general structure and comprises a CMP section 80 wherein the polishing is performed in two systems, and a washing section where the wafers transferred from these systems are washed. A semiconductor wafer 83 loaded is subjected to the polishing of an organic film over the turntable 82 in the CMP section 80, after which the semiconductor wafer 83 is sustained by a polishing unit 84. In the aforementioned embodiment, the slurry-polishing and the water-polishing of the wafer 83 are performed over the polishing pad (not shown) that has been secured to the turntable 82, and then, the wafer 83 is transferred. Incidentally, in this CMP section 80, a dressing unit 85 is also shown.

In the washing section 81, the semiconductor wafer 83 is received by a wafer hanger (not shown) of a wafer-transferring robot 86 from the polishing unit 84 and is transferred to a double roll washing machine 87. Both surfaces of the wafer 83 are washed with pure water by a roll sponge at this double roll washing machine 87, after which the wafer 83 is further transferred by the wafer-transferring robot 86 to a reversing machine 88. The wafer thus reversed is then washed with pure water by a pencil sponge at a pencil washing machine 89 and dried by spin-drying before the wafer is finally housed in a cassette (wafer unloaded).

Then, the wafers after finishing the polishing were investigated with respect to any defects by using KLA2139 (KLA Tencall Co., Ltd.). As a result, the number of residual defects was found as 75 counts. Since the number of residual defects before the coating of the resist as shown in FIG. 2C was 70 counts, it can be said that it was possible to substantially suppress the increase of defects.

Further, the dispersions and the solutions of surfactants as described below were fed onto the polishing pad to obtain various slurries and employed for polishing the resist film under the same conditions as described above.

Slurry (II-2):
A dispersion: A solution containing 1 wt % of PST particle having a primary particle diameter of 200 nm.
Flow rate: 150 cc/min.
A solution of surfactant: An aqueous solution containing 0.2 wt % of potassium dodecylbenzene sulfonate.
Flow rate: 200 cc/min.

Slurry (II-3):
A dispersion: A solution containing 1 wt % of PST particle having a primary particle diameter of 200 nm.
Flow rate: 150 cc/min.
A solution of surfactant: An aqueous solution containing 0.2 wt % of acetylene diol-based nonionic surfactant.
Flow rate: 200 cc/min.

Slurry (II-4):
A dispersion: A solution containing 1 wt % of PST particle having a primary particle diameter of 200 nm.

Flow rate: 150 cc/min.

A solution of surfactant: An aqueous solution containing 0.2 wt % of silicone-based surfactant.

Flow rate: 200 cc/min.

The PST particle employed herein was synthesized by the following procedures. First of all, 92 parts by weight of styrene, 4 parts by weight of methacrylic acid, 4 parts by weight of hydroxyethylacrylate, 0.1 parts by weight of ammonium lauryl sulfate, 0.5 parts of ammonium persulfate and 400 parts of ion-exchange water were placed in a 2 L flask. The resultant mixture was allowed to polymerize for 6 hours with stirring in a nitrogen gas atmosphere and at a temperature of 70° C. As a result, it was possible to obtain PST particle having carboxyl group on the surface thereof, the primary particle diameter thereof being 200 nm.

Slurry (II-5):

A dispersion: A solution containing 1 wt % of PMMA particle having a primary particle diameter of 300 nm.

Flow rate: 150 cc/min.

A solution of surfactant: An aqueous solution containing 0.2 wt % of polycarboxylic acid.

Flow rate: 200 cc/min.

The PMMA particle employed herein was synthesized by the following procedures. First of all, 94 parts by weight of methylmethacrylate, 1 part by weight of methacrylic acid, 5 parts by weight of hydroxymethylmethacrylate, 0.03 parts by weight of ammonium lauryl sulfate, 0.6 parts of ammonium persulfate and 400 parts of ion-exchange water were placed in a 2 L flask. The resultant mixture was allowed to polymerize for 6 hours with stirring in a nitrogen gas atmosphere and at a temperature of 70° C. As a result, it was possible to obtain PMMA particle having carboxyl group on the surface thereof, the primary particle diameter thereof being 300 nm.

When any one of these slurries were employed, it was possible to suppress the increase of defects as described above. In particular, when the slurry (II-4) and the slurry (II-5) were employed, the effect thereof to minimize the generation of defects was prominently recognized. Since a functional group was bonded to the surface of the resin particle in these samples, it was possible to further enhance the dispersibility of the resin particle on account of the functional group. The assurance of the dispersibility of the resin particle is very important factor in viewpoints of polishing property and of storage stability. If the resin particle is not sufficiently dispersed, coarse particle may generate, thereby giving rise to the generation of scratches. Otherwise, the slurry is caused to become a hard cake, thereby deteriorating the storage stability of the slurry. Whereas, according to the slurry (II-4) and the slurry (II-5), since the resin particle is provided, on the surface thereof, with a functional group, there is no possibility of raising the aforementioned undesirable problems.

For the purpose of comparison, the polishing of the resist film was performed under the same conditions as described above except that a solution of surfactant was not employed (Comparative Example 1). Then, the result of polishing was evaluated, finding that the number of residual defects after the polishing was found as many as 200 counts.

As described above, when the second slurry is employed, it is possible to greatly minimize the number of residual defects of an organic film that may be caused due to the residue of resist. The reason for this will be explained with reference to FIG. 20. Since a surfactant is included together with the resin particle 92 in the second slurry on the occasion of polishing an organic film, it is possible to hydrophilize the surfaces of the polishing pad 31 and the wafer 32 on account of the effect of the hydrophilic moiety 93 of the surfactant.

Even if hydrophobic shavings of resist (not shown) are generated, the surfaces of the polishing pad 31 and the wafer 32 can be hydrophilized on account of the effect of the hydrophilic moiety 93 of the surfactant. As a result, the shavings can be easily discharged without remaining on the surface of the polishing pad 31, thereby preventing the shavings from adhering onto the surface of the wafer 32. Namely, as shown in. FIG. 21, the shavings of resist are prevented from being left on the surface of the resist film 19 in the wafer 32 being polished, so that the surface of the resist film 19 can be flattened the entire surface of the wafer 32. Since the shavings of resist are prevented from being left on the surface of the resist film 19, it is possible to obtain a clean surface as described above. Further, since the surface of the resist film 19 is flattened and cleaned, the recessing after the CMP would not be badly affected by the resist film 19, thus making it possible to recess the resist film with the depth of recess being controlled constant as shown in FIG. 22. As a result, the film thickness of the collar oxide film after finishing the etchback thereof can be made uniform, thereby making it possible to minimize the non-uniformity in electric resistance of the buried strap.

Figure 23:
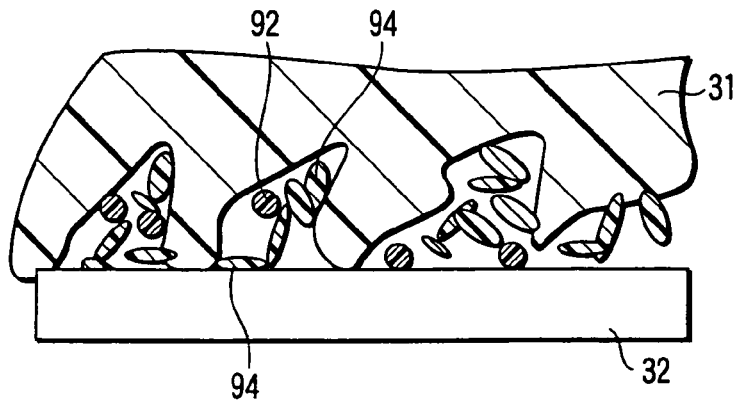
FIG. 23 is a cross-sectional view schematically illustrating a state of the polishing pad and wafer during the polishing according to a comparative example.
Figure 24A:
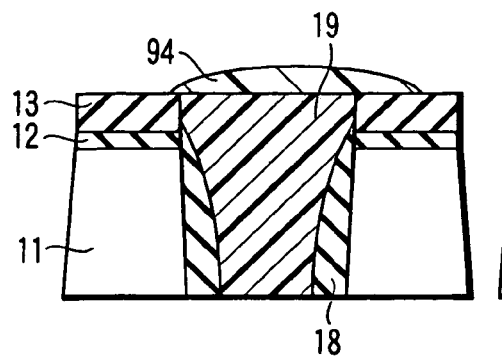
FIGS. 24A and 24B are cross-sectional views of the resist film during the polishing according to a comparative example.
Figure 24B:
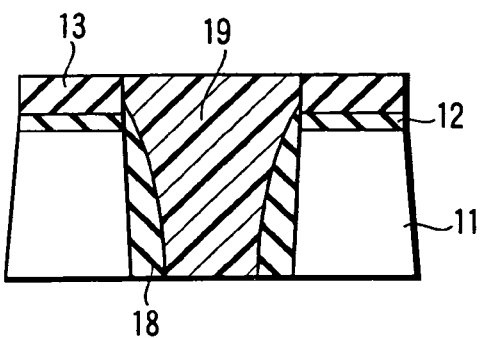

Whereas, since no surfactant was employed in the case of Comparative Example 1, the surfaces of the polishing pad 31 and the wafer 32 were all made hydrophobic as shown in FIG. 23. Further, since the shavings 94 were also hydrophobic, the shavings 94 may, under certain circumstances, adhere onto the surface of the wafer 32. Further, in the wafer 32 being polished, there are co-existed a region where shavings 94 are adhered thereto as shown in FIG. 24A and a region where shavings 94 are not adhered thereto as shown in FIG. 24B. Further, since the Pad nitride film 13 formed on the substrate 11 is not inherently hydrophilic, the shavings 94 of resist are inclined to adhere onto this Pad nitride film 13 as shown in FIG. 24A.

Figure 25A:
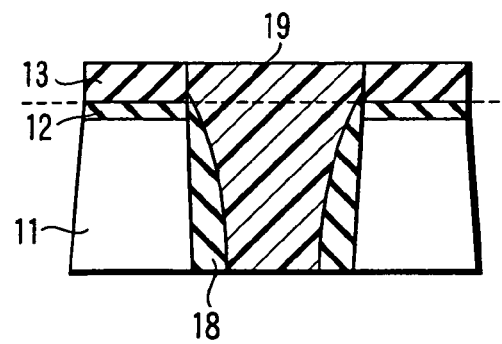
FIGS. 25A and 25B are cross-sectional views each illustrating the resist film after finishing the recessing of the resist film according to a comparative example.
Figure 25B:
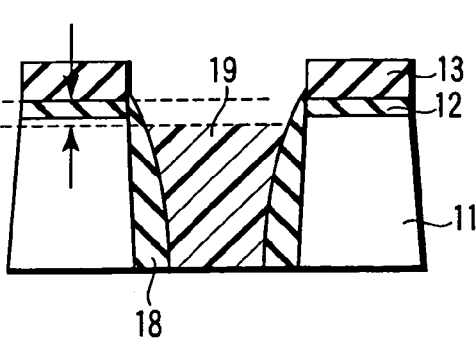

The shavings 94 left on the resist film 19 would give undesirable influence to the recessing step to be performed subsequent to the CMP, thereby generating non-uniformity in depth of the recesses in the resist film 19 after the recessing process thereof as shown in FIGS. 25A and 25B. As a result, it would be impossible to perform the uniform recessing of the resist film, so that the film thickness of the collar oxide film after finishing the etchback thereof would become non-uniform, thereby giving rise to the non-uniformity in electric resistance of the buried strap.

Whereas, according to the method of this embodiment, the shavings of resist can be eliminated from the surface of wafer on account of the effect of the surfactant, thereby making it possible to avoid the aforementioned problems. Incidentally, the polishing method according to this embodiment is widely applicable not only to a photoresist film but also to a hydrophobic organic film represented by a low dielectric constant insulating film such as an organic SOG.

(Embodiment II-2)

In this embodiment, a dispersion containing a resin particle and a solution containing a surfactant were successively fed onto a polishing pad. Thereafter, the polishing of a resist film was performed in the same manner as Embodiment II-1 wherein the slurry (II-1) was employed.

The method of this embodiment will be explained with reference to FIG. 19. In this case, the polishing of the resist film over the turntable 82 is performed by two steps, i.e. a first polishing using a dispersion of resin particle, and then, a second polishing using a solution of surfactant. Upon finishing the second polishing, the wafer 83 is transferred to a washing section 81 and both surfaces of the wafer 83 are washed with pure water by a roll sponge at the double roll washing machine 87, after which the wafer 83 is further subjected to pencil washing and spin-drying before the wafer is finally unloaded.

When the first polishing using a dispersion of resin particle is finished, there may be recognized the residue of the shavings of resist on the surface of the polishing pad as well as on the surface of wafer. These shavings however can be removed by the second polishing using a solution of surfactant according to the mechanism as explained above.

Then, the wafers after finishing the polishing were investigated with respect to any defects by using KLA2139 (KLA Tencall Co., Ltd.). As a result, the number of residual defects was found as 70 counts. Since the number of residual defects before the coating of the resist was 70 counts, it was confirmed that according to the polishing of this embodiment, it was possible to prevent any increase in number of defects. Further, any enlargement of the dishing of resist due to the polishing using a surfactant was hardly recognized, and the polishing velocity of SiN was 1 nm/min or less, thus making it possible to substantially prevent the polishing of the Pad nitride film.

For the purpose of comparison, the polishing of the resist film was performed under the same conditions as described above except that the solution of surfactant was not employed on the polishing pad but employed only on the occasion of the roll sponge washing (Comparative Example 2). Specifically, after finishing the steps of: polishing using only the dispersion of resin particle over the polishing pad; and washing of the wafer using pure water, the wafer was transferred to the double roll washing machine, in which the wafer was washed with the solution of surfactant by using a roll sponge, after which the wafer was further subjected to pencil washing and spin-drying before the wafer was finally unloaded. Then, the result of polishing was evaluated, finding that the number of residual defects after the polishing was found as many as 150 counts.

According to this embodiment, immediately after finishing the polishing of the resist film by using a dispersion of resin particle, the washing of wafer is performed in the polishing process using a solution of surfactant while enabling the wafer to contact with the polishing pad. As a result, it is possible to expect higher washing effects as compared with the washing by a roll sponge. In the case of the washing using a roll sponge as described in Comparative Example 2 however, even if a solution of surfactant is employed, it is impossible to minimize the number of defects that will be caused due to the presence of residue of resist. The hydrophilic group of the surfactant is capable of acting on the polishing cloth as well as on the wafer, thus exhibiting the effects thereof. Therefore, when the solution of surfactant is employed over the polishing pad, it will be made possible to greatly minimize the number of defects that may be caused due to the residue of resist.

(Embodiment II-3)

As in the case of the aforementioned embodiment (II-1), a dispersion containing a resin particle and a solution containing a surfactant were fed, as a chemical mechanical polishing slurry for organic films, onto a polishing pad to perform the polishing of a resist film. Subsequently, the supply of the dispersion of resin particle may be suspended and only the surfactant solution may be fed to the polishing pad. In this case, the polishing using the chemical mechanical polishing slurry and the washing using the surfactant solution can be performed over the polishing pad, thereby making it possible to further enhance the hydrophilizing effects of the surface of the polishing pad and the surface of the wafer. As a result, the number of defects that may be caused due to the residue of resist can be further minimized, thus making it possible to more stably perform the polishing of the resist film.

Due to the employment of the second slurry, the polishing of an organic film such as a resist film can be performed with the density of surface defects being greatly minimized. This second slurry is also applicable to the processes similar to those of Embodiment I-2 and Embodiment I-3 while enabling to achieve almost the same effects obtainable by these embodiments.

According to the embodiment of the present invention, it is possible to enlarge the process margin in the lithography and to establish a manufacturing process of semiconductor device with high yields, and hence the present invention would be very valuable in industrial viewpoint.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A chemical mechanical polishing method of an organic film comprising:
    forming the organic film above a semiconductor substrate;
    contacting the organic film formed above the semiconductor substrate with a polishing pad attached to a turntable;
    subjecting the organic film to a two-step polishing including
        subjecting the organic film to a first polishing to flatten a surface of the organic film with generation of organic shavings by feeding a dispersion containing a resin particle having a primary particle diameter ranging from 0.05 to 5 μm to the polishing pad; and
        after the first polishing, subjecting the organic film to a second polishing subsequent to the first polishing by feeding a solution containing a surfactant having a hydrophilic moiety to the polishing pad which has been subjected to the first polishing, thereby hydrophilizing a surface of the polishing pad to discharge the organic shavings on the surface of the polishing pad, the solution containing the surfactant being different in composition than the dispersion containing the resin particle, the surface of the organic film being flattened without the organic shavings remained.

2. The method according to claim 1, wherein the semiconductor substrate has a trench which is to be filled with the organic film, a nitride film being located between the semiconductor substrate and the organic film.

3. The method according to claim 2, wherein the organic film is made of a hydrophobic material.

4. The method according to claim 3, wherein the hydrophobic material is resist.

5. The method according to claim 2, wherein a surface of the nitride film is exposed by the second polishing.

6. The method according to claim 2, wherein the primary particle diameter of the resin particle is 70% or more of a size of the trench.

7. The method according to claim 2, further comprising, prior to forming the organic film:
    forming a capacitor dielectric film on an inner peripheral surface of the trench;
    forming a storage node electrode on the capacitor dielectric film;
    etching away the storage node electrode and the capacitor dielectric film in an upper portion of the trench; and forming a collar oxide film on an upper inner wail portion of the trench.

8. The method according to claim 7, further comprising:

recessing the organic film in the trench after the second polishing; and subjecting the collar oxide film to an etchback treatment after recessing the organic film.

* * * * *

UNITED STATES PATENT AND TRADEMARK OFFICE
CERTIFICATE OF CORRECTION

PATENT NO.       : 8,685,857 B2
APPLICATION NO.  : 12/289326
DATED            : April 1, 2014
INVENTOR(S)      : Matsui et al.

It is certified that error appears in the above-identified patent and that said Letters Patent is hereby corrected as shown below:

In the Claims

Claim 7, column 25, line 1, change "wail" to --wall--.

Signed and Sealed this
Eighth Day of July, 2014

Michelle K. Lee
*Deputy Director of the United States Patent and Trademark Office*